US009562939B2

United States Patent
Verhulst et al.

(10) Patent No.: US 9,562,939 B2
(45) Date of Patent: *Feb. 7, 2017

(54) SYSTEM AND METHOD FOR IMPEDANCE MEASUREMENT USING SERIES AND SHUNT INJECTION

(71) Applicants: Huntington Ingalls, Inc., Newport News, VA (US); Virginia Tech Intellectual Properties, Inc., Blacksburg, VA (US)

(72) Inventors: Jacob Verhulst, Newport News, VA (US); Mohamed Belkhayat, Annandale, VA (US); Zhiyu Shen, Blacksburg, VA (US); Marko Jaksic, Blacksburg, VA (US); Paolo Mattavelli, Blacksburg, VA (US); Dushan Boroyevich, Blacksburg, VA (US)

(73) Assignees: Huntington Ingalls Incorporated, Newport News, VA (US); Virginia Tech Intellectual Properties, Inc., Blacksburg, VA (US)

( * ) Notice: Subject to any disclaimer, the term of this patent is extended or adjusted under 35 U.S.C. 154(b) by 793 days.

This patent is subject to a terminal disclaimer.

(21) Appl. No.: 13/954,014

(22) Filed: Jul. 30, 2013

(65) Prior Publication Data
US 2014/0032148 A1    Jan. 30, 2014

Related U.S. Application Data

(60) Provisional application No. 61/677,256, filed on Jul. 30, 2012, provisional application No. 61/677,271, filed on Jul. 30, 2012.

(51) Int. Cl.
G01R 25/00    (2006.01)
G01R 29/26    (2006.01)
(Continued)

(52) U.S. Cl.
CPC ............. *G01R 29/26* (2013.01); *G01R 27/02* (2013.01); *G01R 27/16* (2013.01)

(58) Field of Classification Search
CPC ..................................................... G01R 29/26
(Continued)

(56) References Cited

U.S. PATENT DOCUMENTS

2012/0007583 A1*  1/2012  Martens ............. G01R 31/3163
                                                      324/76.39
2013/0099800 A1*  4/2013  Francis .................. G01R 27/02
                                                      324/650

OTHER PUBLICATIONS

Zhiyu Shen et al., *Design and Implementation of Three-phase AC Impedance Measurement Unit (IMU) with Series and Shunt Injection*, 2012 IEEE Applied Power Electronics Conference and Exposition—APEC 2012, pp. 1-8, Feb. 2012.
(Continued)

*Primary Examiner* — Sujoy Kundu
*Assistant Examiner* — Xiuquin Sun
(74) *Attorney, Agent, or Firm* — Hunton & Williams LLP

(57) ABSTRACT

A method for impedance measurement in a three-phase AC system is provided. The method includes injecting a shunt perturbation signal into the three-phase AC system and collecting a response to the shunt perturbation signal, and injecting a series perturbation signal into the three-phase AC system and collecting a response to the series perturbation signal. The response to the shunt perturbation signal and the response to the series perturbation signal are then transferred from abc coordinate to dq coordinates. At least one impedance of the three-phase AC system is calculated based on the response to the shunt perturbation signal and the response to the series perturbation signal.

12 Claims, 19 Drawing Sheets

(51) Int. Cl.
  *G01R 27/02* (2006.01)
  *G01R 27/16* (2006.01)

(58) Field of Classification Search
  USPC .......................................................... 702/65
  See application file for complete search history.

(56) References Cited

OTHER PUBLICATIONS

Zhiyu Shen et al., *Three-phase AC System Impedance Measurement Unit (IMU) using Chirp Signal Injection*, 2012 IEEE Applied Power Electronics Conference and Exposition—APEC 2012, pp. 1-9, Feb. 2012.

Gerald Francis, "An Algorithm and System for Measuring Impedance in D-Q Coordinates", Jan. 25, 2010, pp. 1-163.

Gerald Francis et al., "An Algorithm and Implementation System for Measuring Impedance in the D-Q Domain", IEEE, 2011, pp. 3221-3228.

* cited by examiner

US 9,562,939 B2

SYSTEM AND METHOD FOR IMPEDANCE MEASUREMENT USING SERIES AND SHUNT INJECTION

PRIORITY

This application claims the benefit of U.S. Provisional Application No. 61/677,256, filed Jul. 30, 2012, and U.S. Provisional Application. No. 61/677,721, filed Jul. 30, 2012, both of which are incorporated by reference hereto in their entirety for any purpose.

TECHNICAL FIELD

The present disclosure relates generally to systems and methods for impedance measurement and, more particularly, to systems and methods for impedance measurement using series and shunt injection.

BACKGROUND

The identification and subsequent measurement of source and load impedances are useful tools for assessing and evaluating stability of electrical power systems. The impedance of an alternating current (AC) electrical system may be measured by injecting a perturbation signal in the direct and quadrature (dq) reference frame of the system, and measuring the voltage and current response to the perturbation.

Conventionally, impedances of a system at AC interfaces have been extracted in the direct and quadrature (dq) reference frame using only shunt injection. Problems arise in such conventional impedance measurement methods because the source impedance is usually much smaller than the load impedance at AC interfaces. When perturbing the system using shunt mode, most of the injected current flows into the low impedance source side. The high impedance load side is not disturbed enough, resulting in a low signal-to-noise ratio (SNR) which is not good for measurement accuracy. Further, conventional approaches have generally been limited to linear loads and are not well-adapted for non-linear loads.

Therefore, there is a need for a system and method capable of realizing improved load-side SNR and overall impedance measurement accuracy.

SUMMARY OF THE INVENTION

An illustrative aspect of the invention provides a method of impedance measurement in a three-phase alternating current (AC) system. The method comprises injecting a shunt perturbation signal into the three-phase alternating current AC system and collecting a response to the shunt perturbation signal. The method also comprises injecting a series perturbation signal into the three-phase AC system and collecting a response to the series perturbation signal. The response to the shunt perturbation signal and the response to the series perturbation signal are then transferred from abc coordinate to dq coordinates. The method further comprises calculating at least one impedance of the three-phase AC system based on the response to the shunt perturbation signal and the response to the series perturbation signal.

Another illustrative aspect of the invention provides a system for performing impedance measurement in a three-phase alternating current (AC) system. The system comprises an injection circuit configured to inject a shunt perturbation and a series perturbation signal into the three-phase AC system. The system also comprises a collection circuit configured to collect a response to the shunt perturbation signal and to collect a response to the series perturbation signal. The system further comprises a control unit configured to transfer the response to the shunt perturbation signal and the response to the series perturbation signal from abc coordinate to dq coordinates and to calculate at least one impedance of the three-phase AC system based on the response to the first perturbation signal and the response to the second perturbation signal.

BRIEF DESCRIPTION OF THE DRAWINGS

The accompanying drawings, which are incorporated in and constitute a part of this disclosure, illustrate aspects consistent with the present disclosure and, together with the description, serve to explain advantages and principles of the present disclosure. In the drawings.

DETAILED DESCRIPTION

Figure 1:
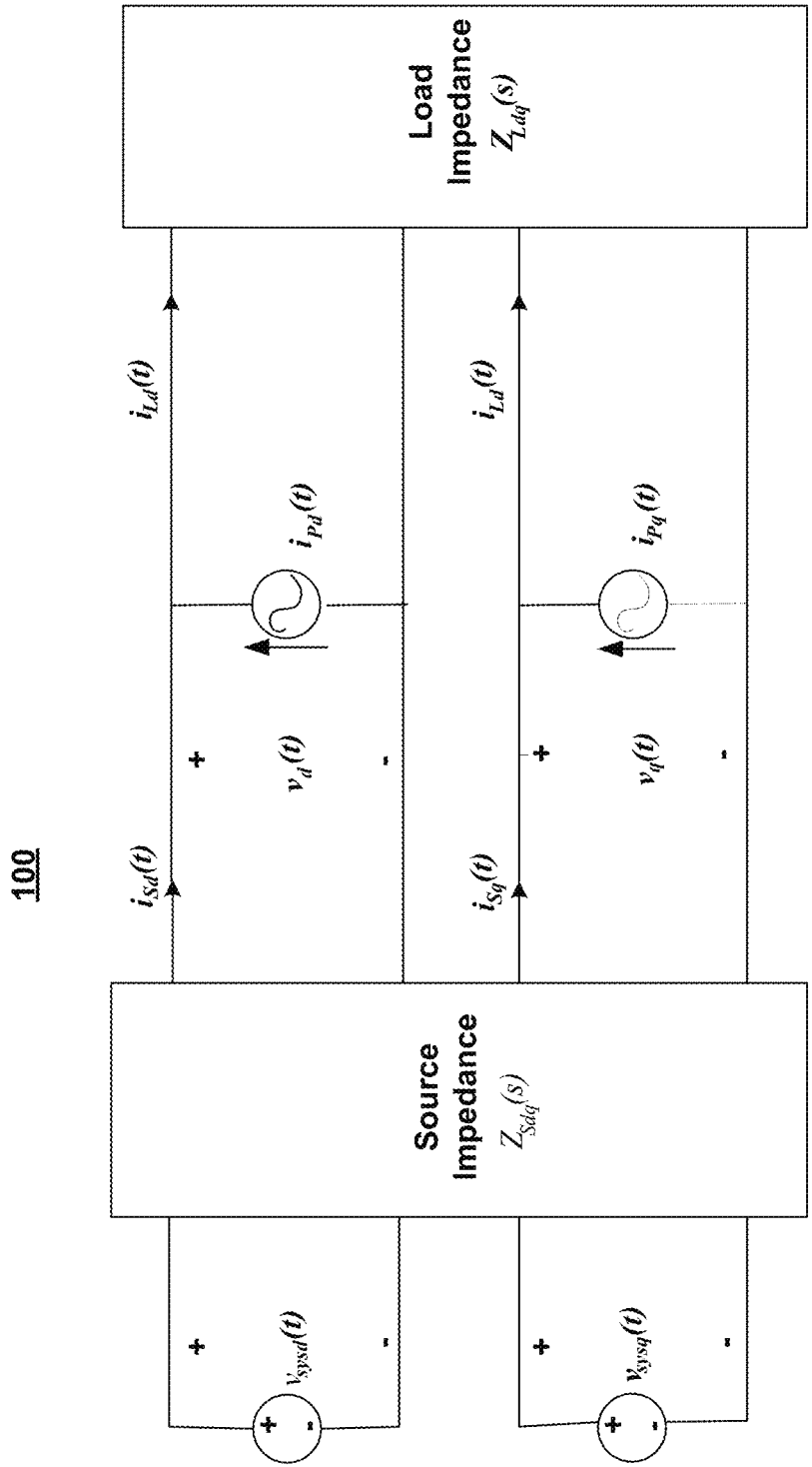
FIG. 1 schematically illustrates an example three-phase alternating current (AC) system in dq coordinates, consistent with certain disclosed embodiments.

Embodiments of the systems and methods described herein enable the extraction of data related to electric power system impedances. Stability of an electric power system can be assessed by frequency domain analysis of the "minor loop gain" transfer function, which is defined as the $Z_S/Z_L$ impedance ratio, where $Z_S$ is the source impedance and $Z_L$ is the load impedance at interfaces where the source(s) and load(s) are connected. The power system may be energized (online) and operating at various loading levels ranging from no-load to full-load. Embodiments of the present invention may use series and shunt modes of perturbation injection to perform impedance measurements at alternating current (AC) power system interfaces.

More particularly, embodiments of the present disclosure use a series injection mode when measuring the high impedance side (typically the load side in AC systems). Further, instead of injecting a perturbation current, a voltage perturbation is used in series perturbation mode. By using this provision, most of the injected power flows to the higher impedance load side, thereby raising the load side measurement SNR resulting in a more accurate measurement. Thus, by using both series injection mode and shunt injection mode, overall impedance measurement can be improved.

The following detailed description refers to the accompanying drawings. Wherever possible, the same reference numbers will be used throughout the drawings and the following description to refer to the same or like parts. While several exemplary embodiments and features are described herein, modifications, adaptations, and other implementations are possible, without departing from the spirit and scope of the disclosure. For example, substitutions, additions or modifications may be made to the components illustrated in the drawings, and the exemplary methods described herein may be modified by substituting, reordering or adding steps to the disclosed methods. Accordingly, the following detailed description is not intended to limit the disclosure to any specific embodiments or examples.

FIG. 1 schematically illustrates an example three-phase AC system 100 in dq coordinates, consistent with certain disclosed embodiments. As shown in FIG. 1, a three-phase balanced and symmetrical system in abc coordinates can be mapped into a stationary system with a constant steady-state operating condition by applying the dq transformation. That is, by applying the dq transformation, a common three-phase AC system receiving shunt current injections can be expressed using an equivalent representation, such as the representation shown by the solid parts of system 100 FIG. 1.

Generally, a shunt is a device that allows electric current to pass around another point in the circuit by creating a low resistance path. In some embodiments, the shunt device may be achieved by placing a resistor, having a known resistance value, in series with the load. The voltage drop across the shunt is proportional to the current flowing through it, which can be calculated because the resistance value is known.

Further, as reflected in FIG. 1, the AC voltages and currents in abc coordinates may be transformed into direct current (DC) components in dq coordinates. In some embodiments, the voltages and currents collected or sensed at the interface may be transformed into constant values in the synchronous coordinates at the steady-state. The small signal impedance can be obtained by linearizing the system around the operating point. In FIG. 1, the dotted lines represent a disturbance to the system. As shown in Equation (1), the small-signal interface voltages and currents are related by the impedances. The disturbance may be, for example, a perturbation.

$$\begin{bmatrix} \tilde{v}_d(s) \\ \tilde{v}_q(s) \end{bmatrix} = Z_{Sdq}(s) \begin{bmatrix} \tilde{i}_{Sd}(s) \\ \tilde{i}_{Sq}(s) \end{bmatrix} \quad \text{Equation (1)}$$

$$\begin{bmatrix} \tilde{v}_d(s) \\ \tilde{v}_q(s) \end{bmatrix} = Z_{Ldq}(s) \begin{bmatrix} \tilde{i}_{Ld}(s) \\ \tilde{i}_{Lq}(s) \end{bmatrix}$$

where $Z_{Sdq}(s)$ is a source impedance matrix;
$Z_{Ldq}(s)$ is a load impedance matrix;
$\tilde{v}_d(s)$ is a d-axis voltage perturbation;
$\tilde{v}_q(s)$ is a q-axis voltage perturbation;
$\tilde{i}_{Sd}(s)$ is a d-axis source current perturbation;
$\tilde{i}_{Sq}(s)$ is a q-axis source current perturbation;
$\tilde{i}_{Ld}(s)$ is a d-axis load current perturbation;
$\tilde{i}_{Lq}(s)$ is a q-axis load current perturbation; and
s is the Laplace parameter.

Figure 2:
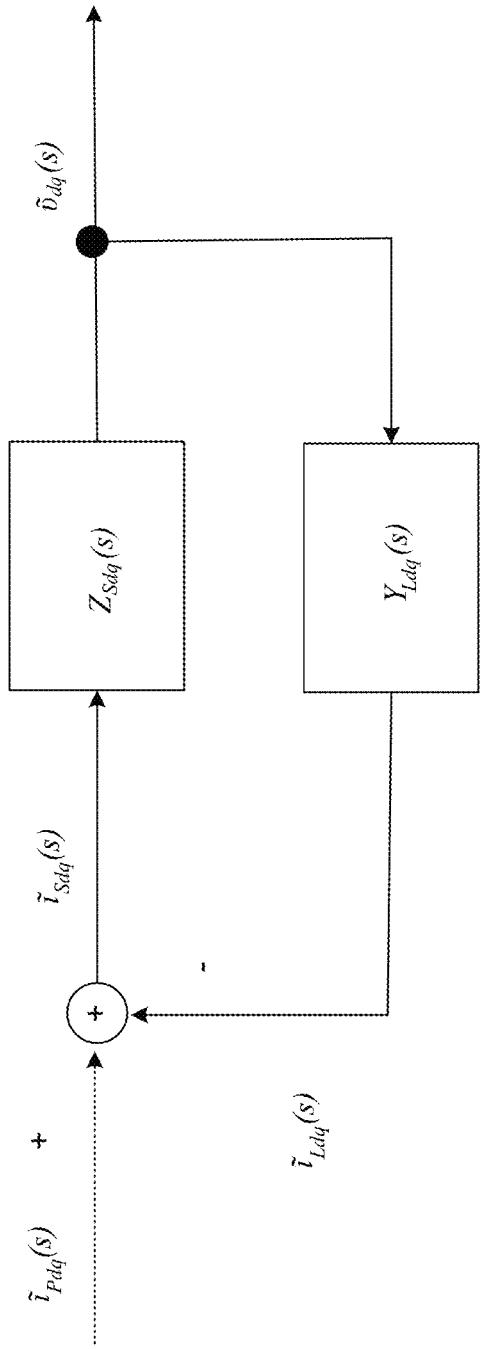
FIG. 2 schematically illustrates an example representation of a system response to disturbance, consistent with certain disclosed embodiments.

FIG. 2 schematically illustrates an example representation 200 of a system response to disturbance, consistent with certain disclosed embodiments. That is, when a disturbance is introduced to a system, such as the currents illustrated by the dashed lines in FIG. 1, the response can be expressed as shown in the example block diagram of FIG. 2. In some embodiments, the disturbance introduced to the system may be a perturbation, and may be introduced for the purpose of measuring a system response. In the example block diagram of FIG. 2, the tildes denote the small signal component of the voltages (i.e., ṽ) and currents (i.e., ĩ) of FIG. 1. Stability of a system, such as the example system of FIG. 2, may be evaluated using the generalized Nyquist stability criterion, which verify whether the characteristic loci of the return ratio matrix $Z_{Sdq}(s)Y_{Ldq}(s)$ encircles the point (−1+0i).

The impedances extracted based on the system response to disturbances, such as the example disturbances reflected in FIG. 2, can be represented by 2×2 matrices, such as that of Equation (2).

$$Z_{Sdq}(s) = \begin{bmatrix} Z_{Sdd}(s) & Z_{Sdq}(s) \\ Z_{Sqd}(s) & Z_{Sqq}(s) \end{bmatrix} \quad \text{Equation (2)}$$

-continued $$Z_{Ldq}(s) = \begin{bmatrix} Z_{Ldd}(s) & Z_{Ldq}(s) \\ Z_{Lqd}(s) & Z_{Lqq}(s) \end{bmatrix}$$

where $Z_{Sdq}(s)$ is a source impedance matrix;
$Z_{Sdd}(s)$ is a dd element of source impedance;
$Z_{Sdq}(s)$ is a dq element of source impedance;
$Z_{Sqd}(s)$ is a qd element of source impedance;
$Z_{Sqq}(s)$ is a qq element of source impedance;
$Z_{Ldq}(s)$ is a load impedance matrix;
$Z_{Ldd}(s)$ is a dd element of load impedance;
$Z_{Ldq}(s)$ is a dq element of load impedance;
$Z_{Lqd}(s)$ is a qd element of load impedance; and
$Z_{Lqq}(s)$ is a qq element of load impedance.

Figure 3:
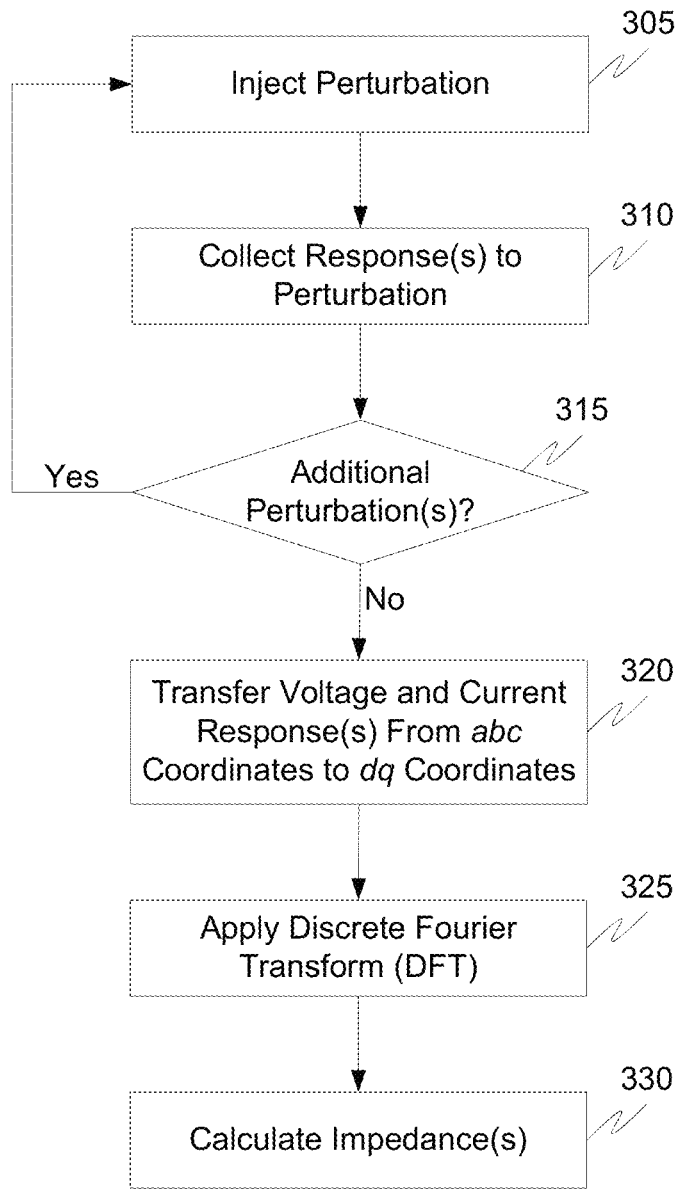
FIG. 3 is an exemplary flow chart illustrating a method of injecting one or more perturbations and determining source and load impedance values, consistent with certain disclosed embodiments.

FIG. 3 presents an exemplary flow chart illustrating a method 300 of injecting one or more disturbances into a power system, and determining source and load impedance values in response to those disturbances, consistent with certain disclosed embodiments. As used herein, a disturbance introduced into the power system may be a perturbation, such as a series injection signal, a shunt injection signal, or any combination of series and shunt injection signals.

In the method 300, a perturbation may be injected into an electrical power system at 305. The electrical power system may be an alternating current (AC) electrical power system. In some example embodiments, the perturbation may include one or more shunt injection signals, such as a chirp signal or a wide-band linear chirp signal. A chirp signal is a signal in which the frequency increases or decreases with time. The term chirp or chirp signal is often used interchangeably with sweep signal or swept-sine signal. Chirp signals may include, for example, linear chirp signals, sinusoidal linear chirp signals, and exponential chirp signals. For linear chirp signals, the instantaneous frequency, which is the derivative of the signal phase, may change linearly as a function of time. The use of shunt injection signals may be referred to as shunt injection mode. Equation (3), shown below, is a time-domain function for a sinusoidal linear chirp signal, consistent with certain disclosed embodiments.

$$x(t) = \sin\left(2\pi\left(f_0 + \frac{f_1 - f_0}{2T}t\right)t\right), \quad \text{Equation (3)}$$

where $f_0$ is a start frequency;
$f_1$ is an end frequency;
T is a duration of the chirp signal; and
t is a time.

In the time domain, the instantaneous frequency may be described by Equation (4) below. The instantaneous frequency may be accompanied by additional frequencies, referred to as harmonics. Generally, a harmonic frequency of a wave is a component frequency of the signal that is an integer multiple of the fundamental frequency. For example, if the fundamental frequency is f, then the harmonics have frequencies of 2f, 3f, 4f, etc. Harmonics exist as a fundamental consequence of frequency modulation. Frequency modulation is the encoding of information in a carrier wave by varying the instantaneous frequency of the wave.

$$f(t) = f_0 + \frac{f_1 - f_0}{2T}t \quad \text{Equation (4)}$$

Additionally and/or alternatively, the perturbation of the example embodiments may include one or more series injection signals. The use of series injection signals may be referred to as a series injection mode. In embodiments, a series injection mode may be used when measuring the high impedance side, which is typically the load side in AC systems. When series injection mode is used, most of the power flows to the higher impedance load side, thereby raising the load side measurement SNR, which can result in a more accurate measurement. Unlike a shunt injection mode, in which a current perturbation is injected into the system, in a series injection mode, a voltage perturbation is injected into the system.

Returning to the method 300 of FIG. 3, circuit responses at the AC interfaces may then be collected at 310. Circuit responses may include $Z_S$, the source impedance, and $Z_L$, the load impedance. In some embodiments, $Z_S$ and $Z_L$ may be measured at interfaces where the source(s) and load(s) are connected.

A determination as to whether additional perturbations are to be injected may be made at 315. In some embodiments, only a single perturbation may be used, while in other embodiments, two perturbations may be used. If the system is held in a steady-state, more than two perturbations may be used to improve measurement accuracy. In some embodiments, a system for carrying out the method 300 may be configured to determine whether additional perturbations are to be performed. This determination may be based on system measurements or by accessing a memory location and retrieving a parameter that defines a number of desired perturbations. The parameter may be set, for example, via a user interface associated with the system. The memory location may include any suitable type of memory, such as, for example, RAM, ROM, programmable read-only memory (PROM), erasable programmable read-only memory (EPROM), electrically erasable programmable read-only memory (EEPROM), magnetic disks, optical disks, floppy disks, hard disks, removable cartridges, flash drives, any type of tangible and non-transitory storage medium. The system may make the determination using a computer processor executing computer program instructions, and the computer program instructions may also be stored in a memory associated with the system and/or computer processor.

When the system determines that additional perturbations are desired (315, Yes), one or more additional perturbations may be injected into the system (305) and the responses collected (310), as discussed above.

When no additional perturbations are to be injected (315, No), the collected voltage and current responses may be transferred from the abc coordinate domain to the dq coordinate domain using a phase obtained by a Phase-Locked Loop (PLL) operating in real-time during the response acquisition (320). After the coordinate transformation from the abc coordinate domain to the dq coordinate domain, a Discrete Fourier Transform (DFT) may be used to obtain the spectra of the voltages and currents (325).

In one example of the systems and methods for extracting system impedances from a physical system, small disturbances may be injected into the system. The small disturbances may be signal injections, such as, for example, shunt injection signals, chirp injection signals, series injection signals, etc. The circuit responses at the AC interface may be collected through, for example, one or more sensors and then used to calculate the impedances. As shown above in Equations (1) and (2), two independent perturbations may be used to derive four scalar impedances of the matrix. In certain embodiments, it may be assumed that the system is held at the same state during the two perturbations, which implies that impedance matrices do not change during the measurement.

Referring to the system illustrated in FIG. 1, a first perturbation may be created by injecting only current $i_{Pd}$ while setting $i_{Pq}$ to zero. In this example, $i_{Pd}$ is the d-axis perturbation or injection signal and $i_{Pq}$ is the q-axis perturbation or injection signal. The response to the first perturbation—or the d-axis injection—can be measured to obtain Equation (5).

$$\begin{bmatrix} \tilde{v}_{d1}(s) \\ \tilde{v}_{q1}(s) \end{bmatrix} = Z_{Sdq}(s) \begin{bmatrix} \tilde{i}_{Sd1}(s) \\ \tilde{i}_{Sq1}(s) \end{bmatrix} \quad \text{Equation (5)}$$

$$\begin{bmatrix} \tilde{v}_{d1}(s) \\ \tilde{v}_{q1}(s) \end{bmatrix} = Z_{Ldq}(s) \begin{bmatrix} \tilde{i}_{Ld1}(s) \\ \tilde{i}_{Lq1}(s) \end{bmatrix}$$

where $Z_{Sdq}(s)$ is a source impedance matrix;
$Z_{Ldq}(s)$ is a load impedance matrix;
$\tilde{v}_{d1}(s)$ is a first perturbation in d-axis voltage;
$\tilde{v}_{q1}(s)$ is a first perturbation in q-axis voltage;
$\tilde{i}_{Sd1}(s)$ is a first perturbation in d-axis source current;
$\tilde{i}_{Sq1}(s)$ is a first perturbation in q-axis source current;
$\tilde{i}_{Ld1}(s)$ is a first perturbation in d-axis load current; and
$\tilde{i}_{Lq1}(s)$ is a first perturbation in q-axis load current.

A second perturbation may be achieved by injecting only current $i_{Pq}$ while setting $i_{Pd}$ to zero. The response to the second perturbation—or the q-axis injection—can be measured to obtain Equation (6).

$$\begin{bmatrix} \tilde{v}_{d2}(s) \\ \tilde{v}_{q2}(s) \end{bmatrix} = Z_{Sdq}(s) \begin{bmatrix} \tilde{i}_{Sd2}(s) \\ \tilde{i}_{Sq2}(s) \end{bmatrix} \quad \text{Equation (6)}$$

$$\begin{bmatrix} \tilde{v}_{d2}(s) \\ \tilde{v}_{q2}(s) \end{bmatrix} = Z_{Ldq}(s) \begin{bmatrix} \tilde{i}_{Ld2}(s) \\ \tilde{i}_{Lq2}(s) \end{bmatrix}$$

where $Z_{Sdq}(s)$ is a source impedance matrix;
$Z_{Ldq}(s)$ is a load impedance matrix;
$\tilde{v}_{d2}(s)$ is a second perturbation in d-axis voltage;
$\tilde{v}_{q2}(s)$ is a second perturbation in q-axis voltage;
$\tilde{i}_{Sd2}(s)$ is a second perturbation in d-axis source current;
$\tilde{i}_{Sq2}(s)$ is a second perturbation in q-axis source current;
$\tilde{i}_{Ld2}(s)$ is a second perturbation in d-axis load current; and
$\tilde{i}_{Lq2}(s)$ is a second perturbation in q-axis load current.

As shown below, Equation (7) may be obtained by combining Equation (5) and Equation (6) to generate a transfer function. That is, combining Equations (5) and (6) from the separate perturbation signals on the d channel and q channel may form a two-by-two matrix, which cannot be obtained by a single perturbation.

$$\begin{bmatrix} \tilde{v}_{d1}(s) & \tilde{v}_{d2}(s) \\ \tilde{v}_{q1}(s) & \tilde{v}_{q2}(s) \end{bmatrix} = Z_{Sdq}(s) \begin{bmatrix} \tilde{i}_{Sd1}(s) & \tilde{i}_{Sd2}(s) \\ \tilde{i}_{Sq1}(s) & \tilde{i}_{Sq2}(s) \end{bmatrix} \quad \text{Equation (7)}$$

$$\begin{bmatrix} \tilde{v}_{d1}(s) & \tilde{v}_{d2}(s) \\ \tilde{v}_{q1}(s) & \tilde{v}_{q2}(s) \end{bmatrix} = Z_{Ldq}(s) \begin{bmatrix} \tilde{i}_{Ld1}(s) & \tilde{i}_{Ld2}(s) \\ \tilde{i}_{Lq1}(s) & \tilde{i}_{Lq2}(s) \end{bmatrix}$$

From Equation (7), the impedance matrices can be solved as shown in Equation (8) below.

$$Z_{Sdq}(s) = \begin{bmatrix} \tilde{v}_{d1}(s) & \tilde{v}_{d2}(s) \\ \tilde{v}_{q1}(s) & \tilde{v}_{q2}(s) \end{bmatrix} \begin{bmatrix} \tilde{i}_{Sd1}(s) & \tilde{i}_{Sd2}(s) \\ \tilde{i}_{Sq1}(s) & \tilde{i}_{Sq2}(s) \end{bmatrix}^{-1} \quad \text{Equation (8)}$$

$$Z_{Ldq}(s) = \begin{bmatrix} \tilde{v}_{d1}(s) & \tilde{v}_{d2}(s) \\ \tilde{v}_{q1}(s) & \tilde{v}_{q2}(s) \end{bmatrix} \begin{bmatrix} \tilde{i}_{Ld1}(s) & \tilde{i}_{Ld2}(s) \\ \tilde{i}_{Lq1}(s) & \tilde{i}_{Lq2}(s) \end{bmatrix}^{-1}$$

In addition, one or more additional frequency points of interest may be identified and the impedance calculations of Equation (8) may be repeated at each identified frequency point of interest. In such embodiments, the voltage and current vectors may be acquired by frequency sweep or by applying a FFT on wide bandwidth signal responses. Generally, the term "frequency sweep" refers to the scanning of a frequency band to detect transmitted signals. A Fourier transform is used to convert time or space to frequency and vice versa. An FFT is an algorithm that may be used to compote the DFT and its inverse. More perturbations can be used to improve the measurement accuracy. The system is assumed to have the same operating point during the two perturbations, which implies that impedance matrices do not change during measurement.

Some factors that may affect the signal level of the disclosed embodiments include the SNR, the perturbation power, and perturbation distribution. In the disclosed embodiments, a higher SNR may be more desirable because it allows for a more accurate measurement. To increase SNR, the noise level may be decreased and/or the signal level may be increased. While the injected perturbation level may be as high as the perturbation generation device is able to produce, the perturbations should not be too large as to inadvertently excite system nonlinearity or change the operating point. This is because the impedances measured are the small signal impedances at a certain operating point. Thus, in embodiments, the injected power may be limited to a few percent of the power of the operating point being measured.

In addition to perturbation power, perturbation distribution in the system may also affect signal level. System impedances are measured at the three-phase AC interface and, due to the source and load impedance, response to the injection may be split into two portions. Each of the source and load parts of the system may only be allocated one portion of the power. Therefore, even if the maximum allowable perturbation level is used, the one part of the system may not be perturbed enough.

Referring to FIG. 1, injection currents applied to the source and load sides of a shunt injection system may be calculated using Equation (9) below.

$$\begin{bmatrix} I_{sd}(s) \\ I_{sq}(s) \end{bmatrix} = Z_{Ldq}(s)(Z_{Sdq}(s) + Z_{Ldq}(s))^{-1} \begin{bmatrix} I_{pd}(s) \\ I_{pq}(s) \end{bmatrix} \quad \text{Equation (9)}$$

$$\begin{bmatrix} I_{Ld}(s) \\ I_{Lq}(s) \end{bmatrix} = Z_{Sdq}(s)(Z_{Sdq}(s) + Z_{Ldq}(s))^{-1} \begin{bmatrix} I_{pd}(s) \\ I_{pq}(s) \end{bmatrix}$$

where $Z_{Sdq}(s)$ is a source impedance matrix;
$Z_{Ldq}(s)$ is a load impedance matrix;
$I_{sd}(s)$ is a d-axis source current;
$I_{sq}(s)$ is a q-axis source current;
$I_{pd}(s)$ is a d-axis perturbation current;
$I_{pq}(s)$ is a q-axis perturbation current;
$I_{Ld}(s)$ is a d-axis load current; and
$I_{Lq}(s)$ is a q-axis load current.

Thus, referring to Equation (9), the current distribution may be determined only by the system impedances. In many systems, stiff output characteristics of source is desirable, which makes most of the injected current flow into the source side. In this case, the result may be that load side is only very slightly perturbed. One way to change the perturbation distribution is to change the injection device connection.

Figure 4:
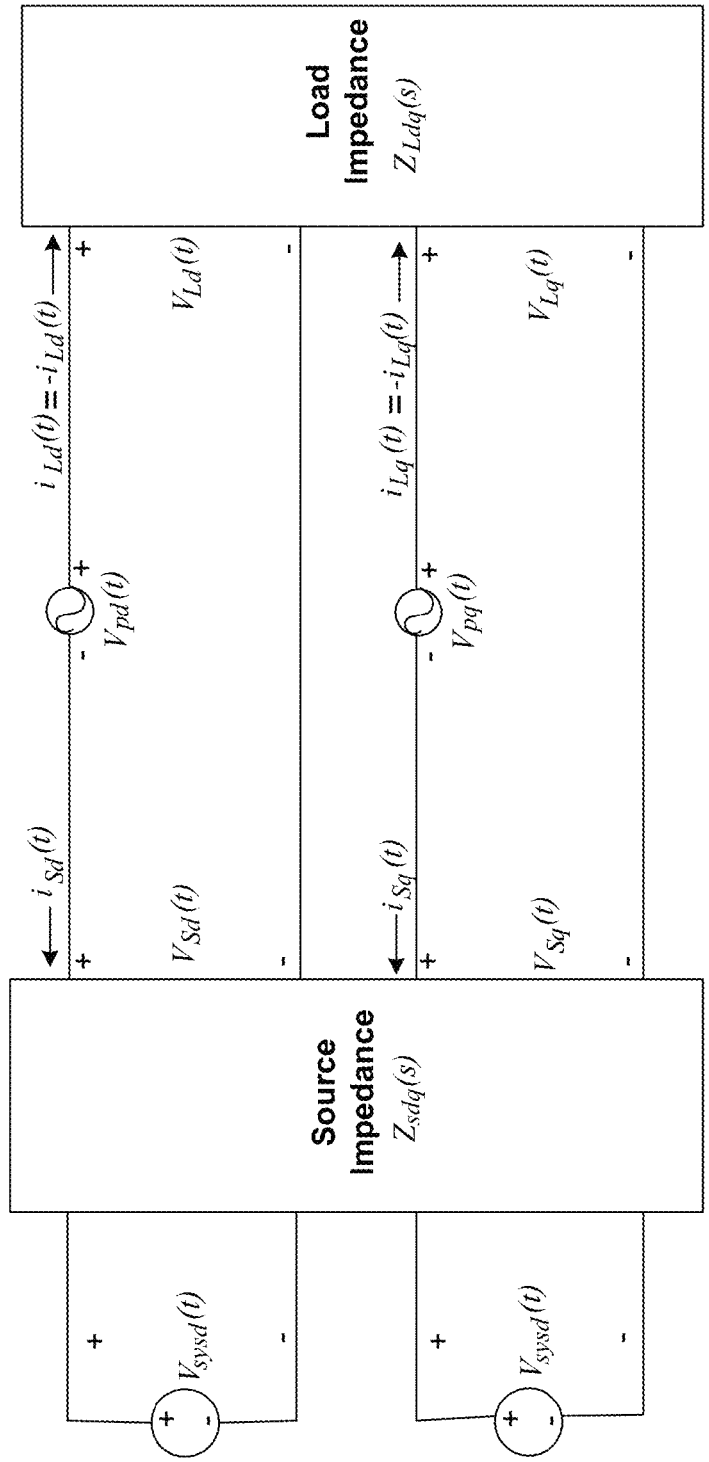
FIG. 4 schematically illustrates an example three-phase alternating current (AC) system in dq coordinates, consistent with certain disclosed embodiments.

FIG. 4 schematically illustrates an example three-phase alternating current (AC) system 400 in dq coordinates, consistent with certain disclosed embodiments. In particular, FIG. 4 illustrates a series injection system 400. If series injection as shown in FIG. 4 is used, the distribution of injected power may be changed according to Equation (10).

$$\begin{bmatrix} V_{sd}(s) \\ V_{sq}(s) \end{bmatrix} = Z_{Sdq}(s)(Z_{Sdq}(s) + Z_{Ldq}(s))^{-1} \begin{bmatrix} V_{pd}(s) \\ V_{pq}(s) \end{bmatrix}$$

$$\begin{bmatrix} V_{Ld}(s) \\ V_{Lq}(s) \end{bmatrix} = Z_{Ldq}(s)(Z_{Sdq}(s) + Z_{Ldq}(s))^{-1} \begin{bmatrix} V_{pd}(s) \\ V_{pq}(s) \end{bmatrix}$$

Equation (10)

where $Z_{Sdq}(s)$ is a source impedance matrix;
$Z_{Ldq}(s)$ is a load impedance matrix;
$V_{sd}(s)$ is a d-axis source voltage;
$V_{sq}(s)$ is a q-axis source voltage;
$V_{pd}(s)$ is a d-axis perturbation voltage;
$V_{pq}(s)$ is a q-axis perturbation voltage;
$V_{Ld}(s)$ is a d-axis load voltage; and
$V_{Lq}(s)$ is a q-axis load voltage.

If the impedance matrices are the same as above in Equations (6) through (8), most of the perturbation power may go to the load side, which is to be measured. Further, in a stiff system, perturbation power tends to flow into just one side of the system for both shunt injection and series injection, and better measurements can be obtained when both are utilized. In some embodiments, for practical injection circuits, a switching converter may be used due to its low loss. Although the switching frequency of the semiconductor devices may be limited when the power rating goes higher, multi-level or interleaved techniques can be applied to achieve high enough equivalent switching frequency.

Figure 5A:
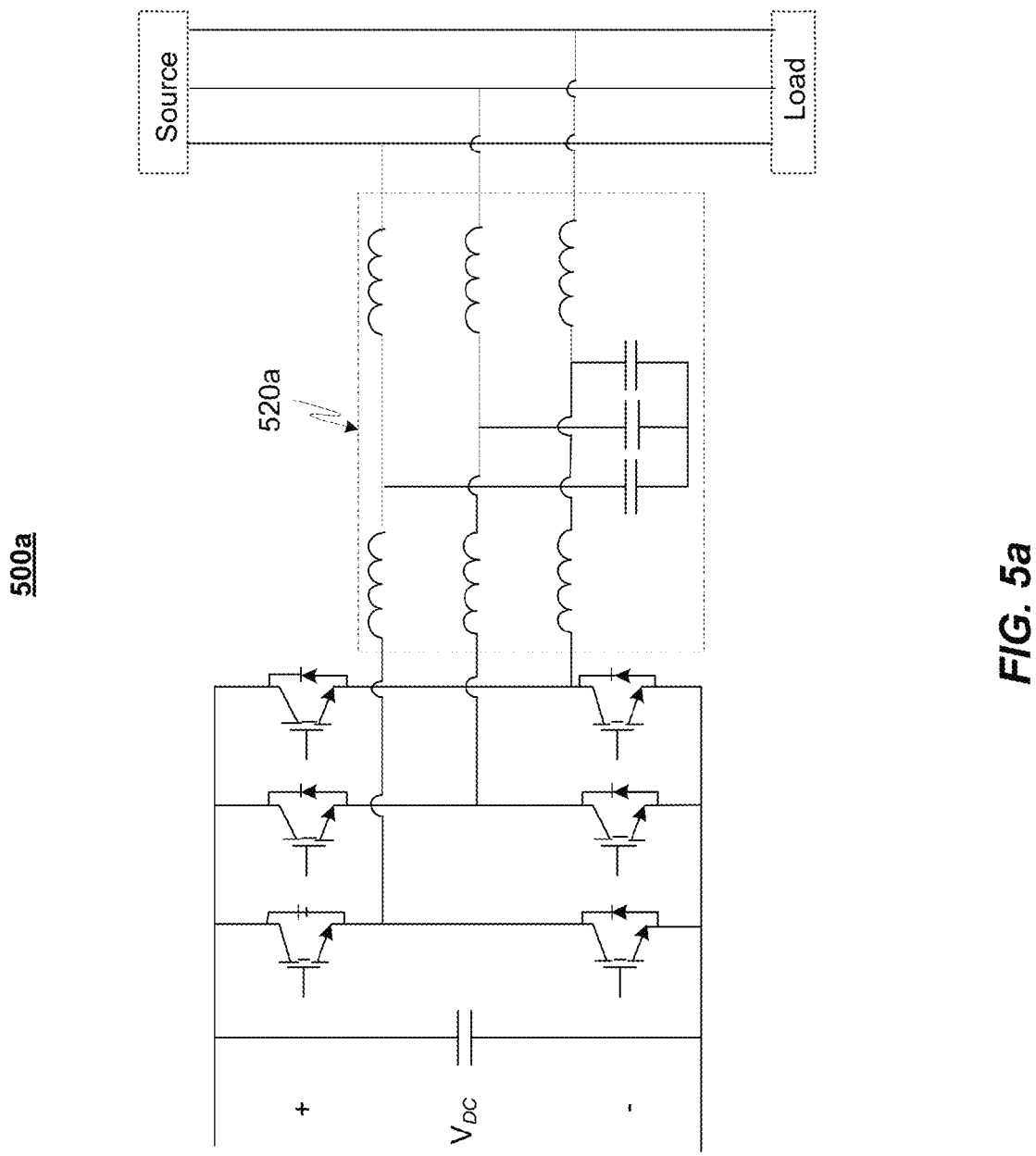
FIG. 5a schematically illustrates an example shunt injection circuit, consistent with certain disclosed embodiments.
Figure 5B:
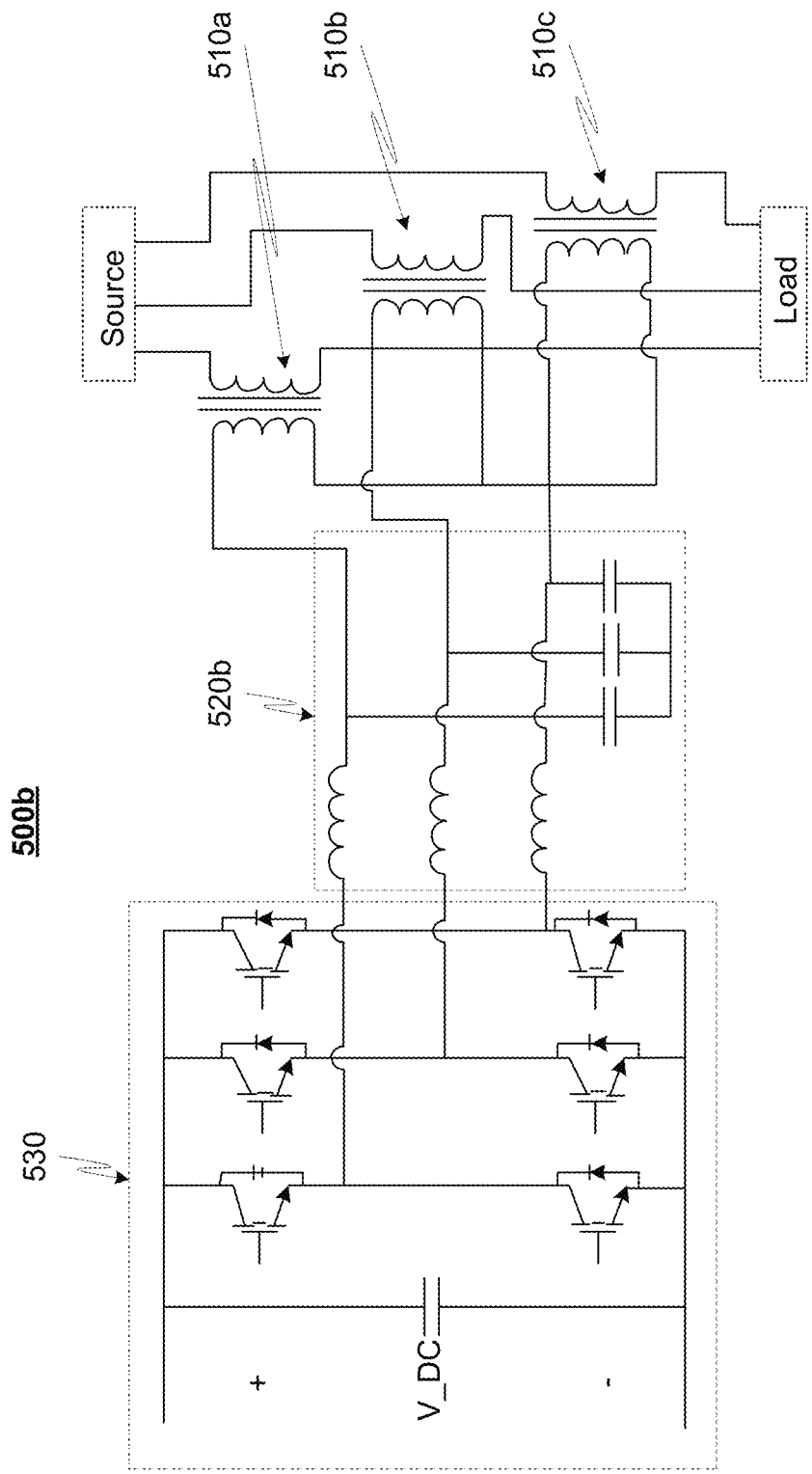
FIG. 5b schematically illustrates an example series injection circuit, consistent with certain disclosed embodiments.

FIGS. 5a and 5b schematically illustrate example injection circuits 500a, 500b, consistent with certain disclosed embodiments. Specifically, FIG. 5a illustrates an example shunt injection circuit 500a, whereas FIG. 5b illustrates an example series injection circuit 500b. In order to measure system impedance, about 0.5% to 5% of the system power may be desirable to obtain good measurements. For the power level of the system to be measured, a two-level Voltage Source Inverter (VSI) including both the shunt injection circuit of FIG. 5a and the series injection circuit of FIG. 5b may be used.

Referring to FIG. 5a, when shunt injection is used, the VSI may be connected to the system via an output filter 520a, which may attenuate the switching frequency ripple. The converter may run with a current control. Since the measurement frequency does not include direct current (DC), no active power is necessary except for compensating the loss of the converter. Thus, the VSI in the unit is designed to run without a DC side power supply, which is similar to an active power filter (APF). A DC voltage loop may be implemented for this purpose. Further, the bandwidth of the DC control loop may be designed to be lower than the lowest measurement frequency to avoid interference on the injection.

Referring to FIG. 5b, when series injection is used, the VSI may be first connected to an output filter, then connected to the system through transformers 510, such as, for example, transformer 510a, transformer 510b, and transformer 510c. The transformers 510 may provide desired isolation and boost the current capability of the injection circuit, such that the injection circuit may carry the full system currents. The VSI controller may be configured to run in an open-loop to generate series voltage perturbation, except for the DC voltage control loop. As further shown in FIG. 5b, the output may be filtered by an L-C filter stage, such as, for example, L-C filter stage 1020, and then placed in series through transformers 1010. A DC voltage controller such as, for example, DC voltage controller 1030, having a very low control bandwidth may supply the converter from the system to be measured. Since no active power is injected into the system, the energy consumption of the converter is only the loss of the circuit. Therefore, the operating point of the system is not affected by the injection circuit.

Figure 6A:
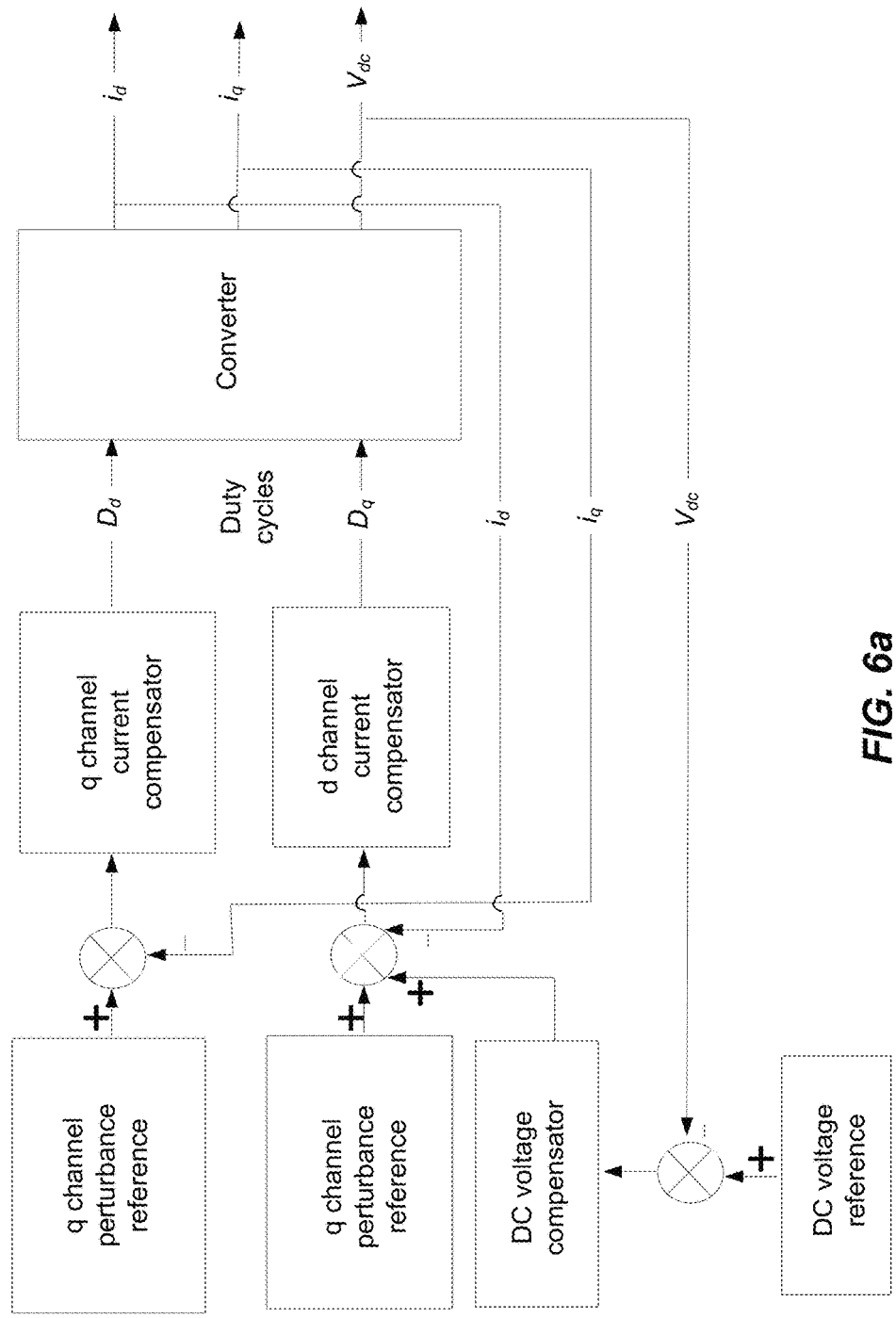
FIG. 6a is a block diagram illustrating an example control diagram of a shunt injection circuit, consistent with certain disclosed embodiments.
Figure 6B:
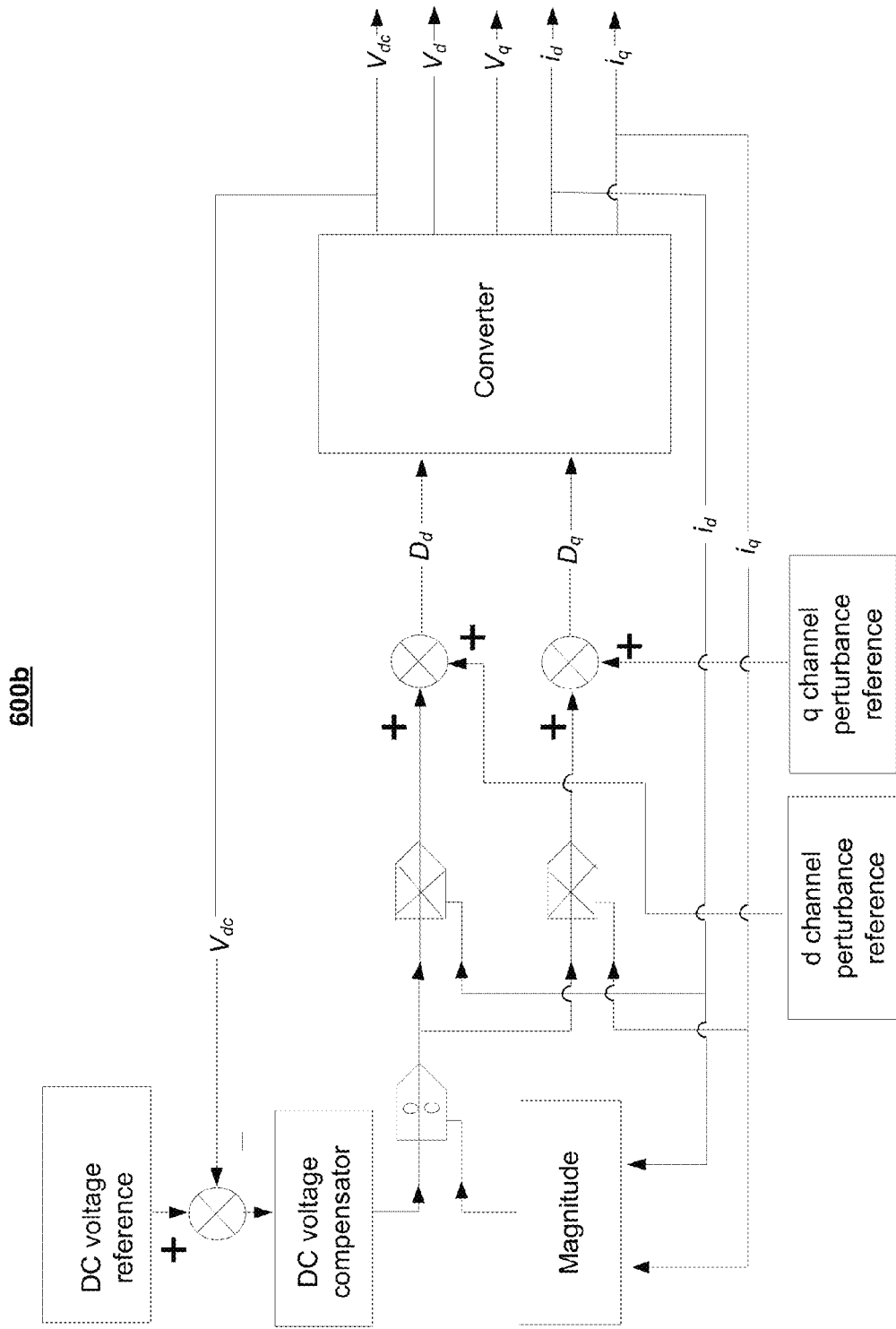
FIG. 6b is a block diagram illustrating an example control diagram of a series injection circuit, consistent with certain disclosed embodiments.

FIGS. 6a and 6b are block diagrams illustrating example circuit control diagrams, where the d channel is the active power channel, consistent with certain disclosed embodiments. Specifically, FIG. 6a is a block diagram illustrating an example shunt injection circuit control 600a, and FIG. 6b is a block diagram illustrating an example series injection circuit control 600b.

Figure 7:
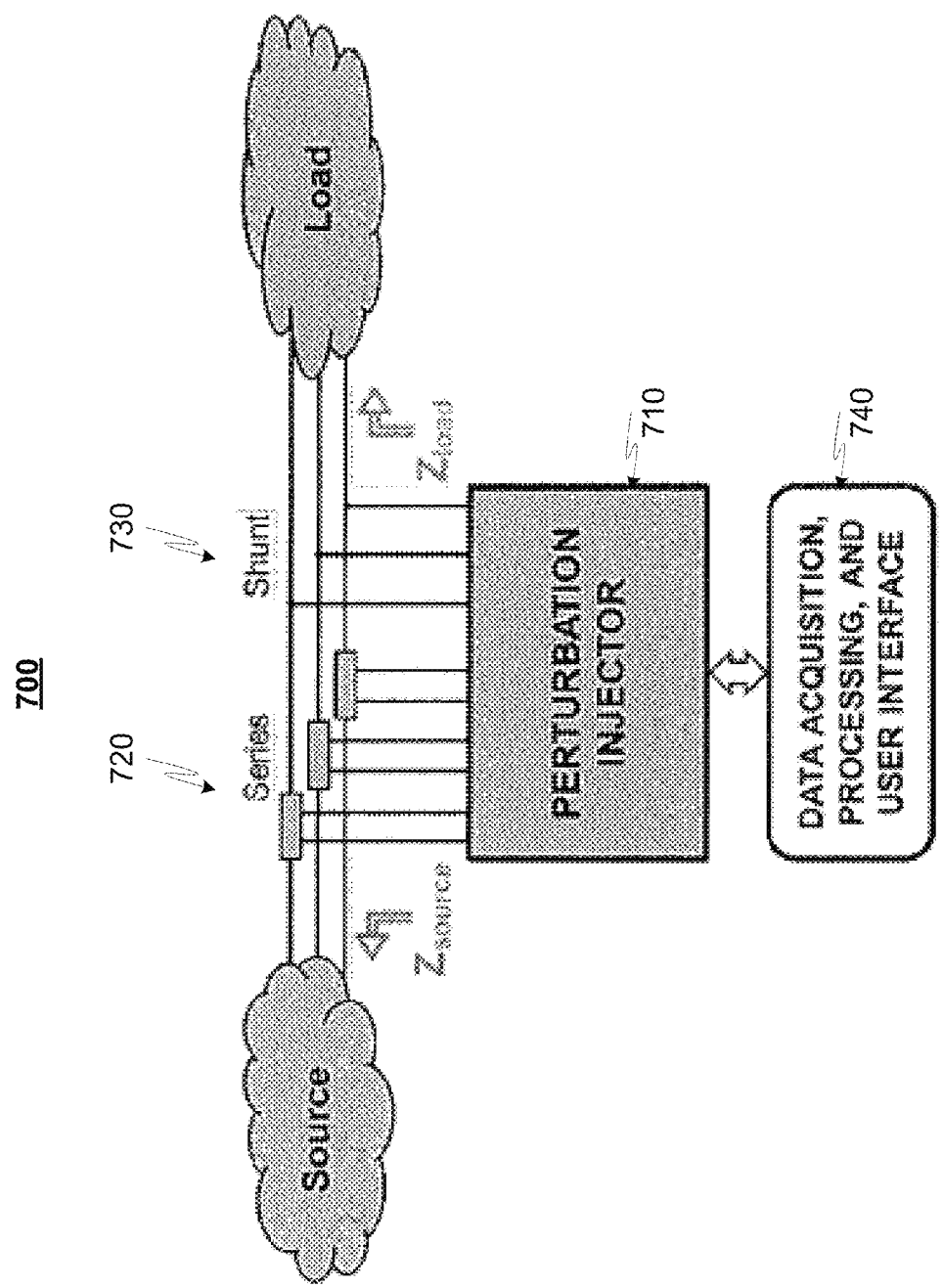
FIG. 7 is a block diagram illustrating an example representation of a system using both shunt injection and series injection, consistent with certain disclosed embodiments.

FIG. 7 is a block diagram illustrating an example representation of a system 700 using both shunt injection and series injection, consistent with certain disclosed embodiments. As shown in FIG. 7, a perturbation injector 710 may inject perturbation into the system 700. In certain disclosed embodiments, perturbation injector 710 may inject voltage perturbation $Z_{source}$ using a series injection circuit 720. In addition, perturbation injector 710 may inject current perturbation $Z_{load}$ using a shunt injection circuit 730. Data acquisition, processing, and user interface 740 may be used to set and control perturbation injections, both voltage and current. Data acquisition, processing, and user interface 740 may also be used to measure responses at the interfaces, convert the responses into low level analog signals, which are transformed from abc coordinates to dq coordinates, and calculate impedances.

Figure 8:
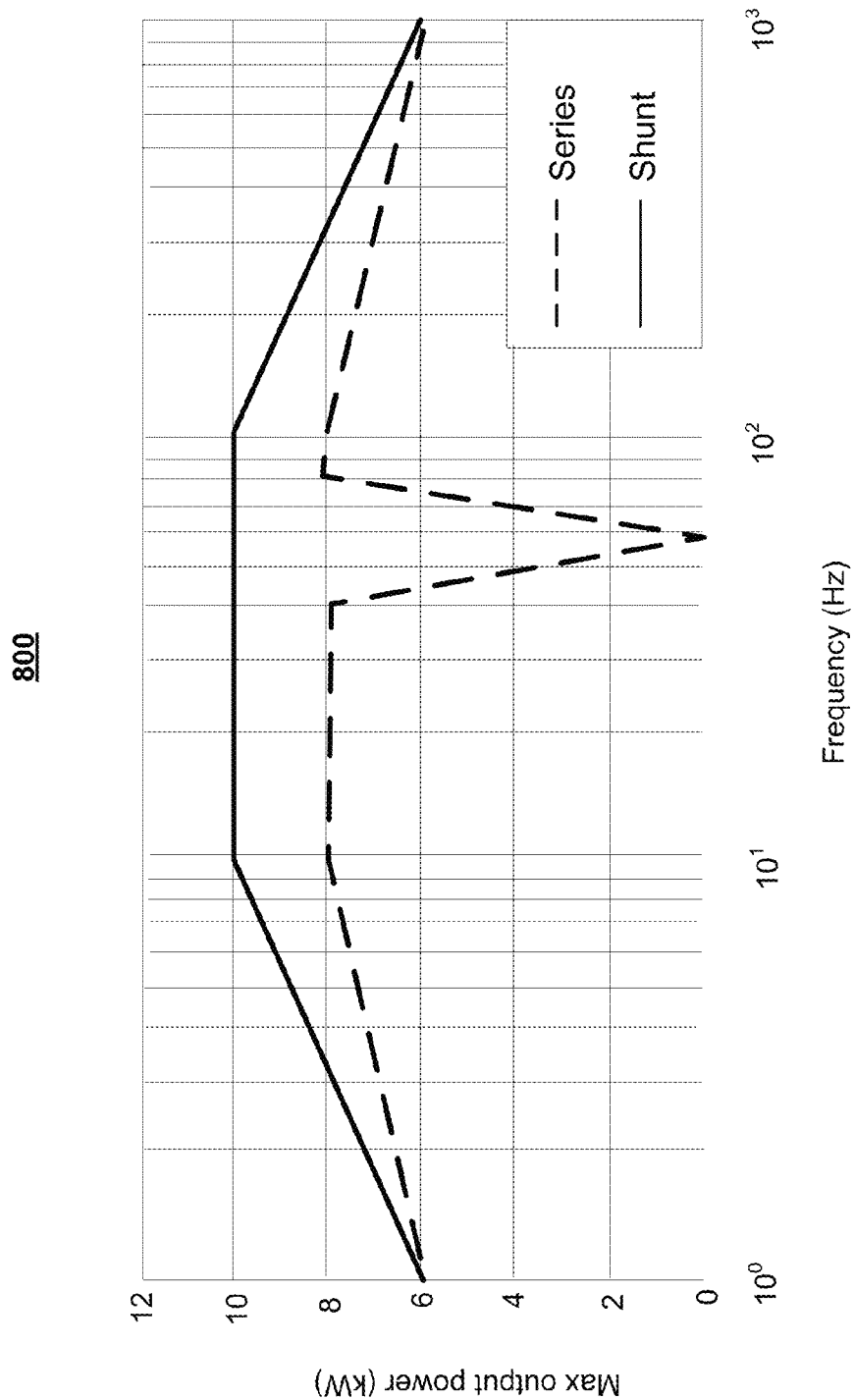
FIG. 8 is a graph illustrating an example maximum injection power over frequency, consistent with certain disclosed embodiments.

FIG. 8 is a graph illustrating an example maximum injection power over frequency, consistent with certain disclosed embodiments. That is, the solid line of FIG. 8 represents the relationship between maximum output power (Kw) and frequency (Hz) for a shunt injection signal, whereas the dashed line of FIG. 8 represents the relationship between maximum output power (Kw) and frequency (Hz) for a series injection signal. For the whole measurement frequency range, it is desirable to inject enough perturbation to obtain a measurable response from the system. The achievable injection power may be limited by several factors. The maximum injection power considering all limits of the design is summarized in FIG. 8.

By running without a DC side power source, the design may introduce some limit on the output power due to the DC capacitance value. Although DC voltage control may be designed to supply the converter from the system, the loop bandwidth may be designed to be lower than the lowest measurement frequency to avoid interference on the injection waveform. The injection power is averaged to be zero over a long time, but during one period of the injection signal, the DC capacitor should be able to supply the power without significantly dropping its voltage.

Assuming a sinusoidal injection waveform, the desired capacitance may be calculated from an energy balance equation, such as, for example, Equation (11).

$$\frac{1}{2}(V_{dc}^2 - (V_{dc} - \Delta V_{dc})^2)C = \int_0^{\frac{1}{2f_{inj}}} V_{sys} I_{inj} \sin(2\pi f_{inj} t) dt \quad \text{Equation (11)}$$

where $V_{dc}$ is a normal DC voltage;
$\Delta V_{dc}$ is a maximum allowable voltage drop;
C is a capacitance;
$V_{sys}$ is a system voltage magnitude in dq coordinates;
$I_{inj}$ is a magnitude of the injection;
$f_{inj}$ is an injection frequency; and
t is time.

The left side of Equation (11) reflects the energy provided by the capacitor, while the right side of Equation (11) reflects the energy injected into the system during half of the injection signal period. For series injection, the capacitance may be calculated similarly using load current magnitude and injection voltage magnitude.

In some embodiments, injection power may be limited by the use of the transformer(s). The transformer(s) may provide isolation and voltage/current adaptation so that the same converter can be used for both shunt and series injection. However, the capability of injecting low frequency voltage may be limited by transformer saturation and the injection voltage must be decreased when the frequency is lower. Since the dq transformation maps a zero hertz component in stationary coordinates to the system fundamental frequency point in synchronous coordinates, the limit on transformer saturation may result in a notch on the injected power around the fundamental frequency in dq coordinates, as shown in FIG. 8. Although transformers may be used because of their simplicity in the current design, transformerless designs may also be desirable to make the frequency range around the fundamental frequency in dq coordinates measureable. In some cases, the output filter may impose limits at the high frequency range.

Figure 9A:
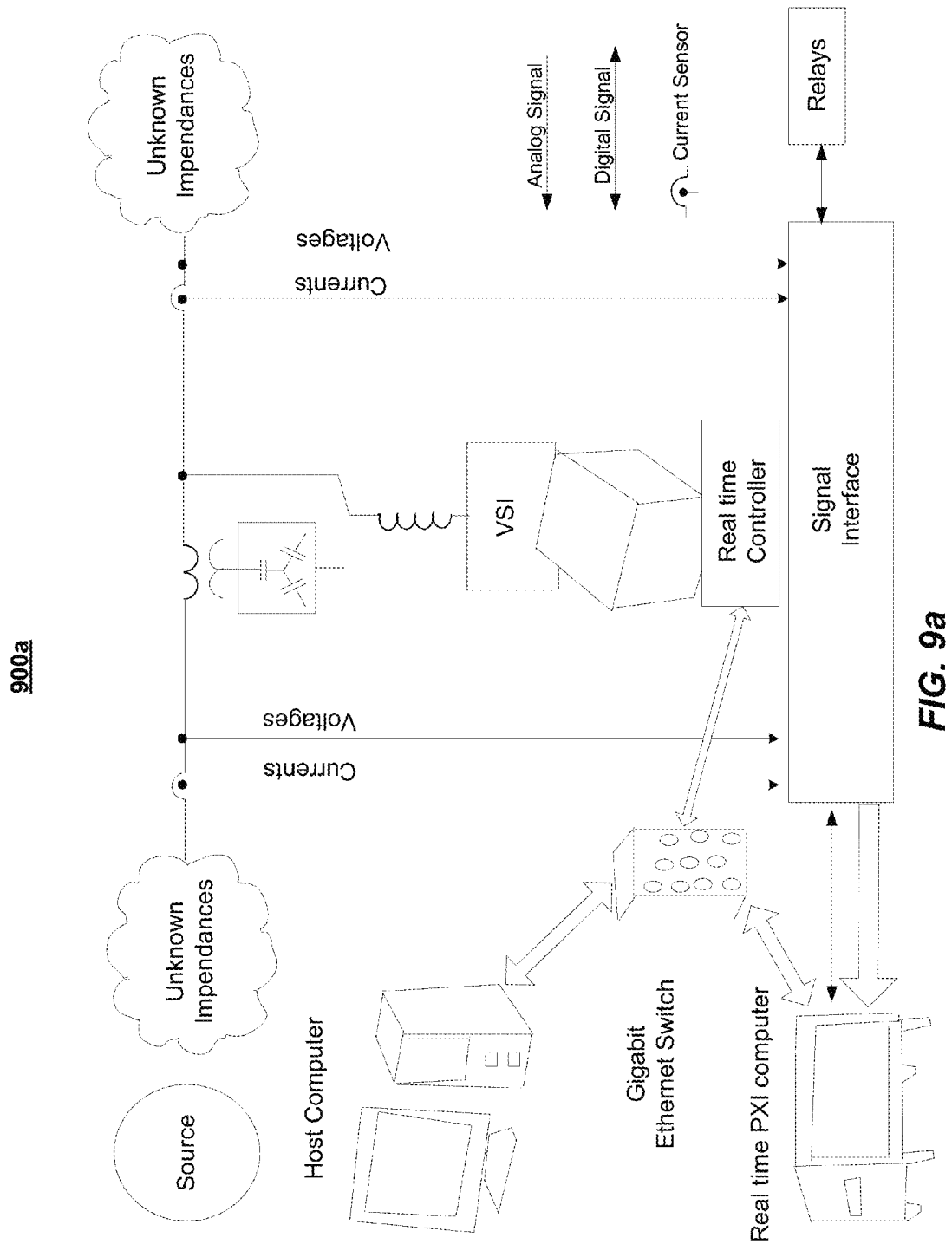
FIG. 9a is a block diagram illustrating an example impedance measurement system, consistent with certain disclosed embodiments.
Figure 9B:
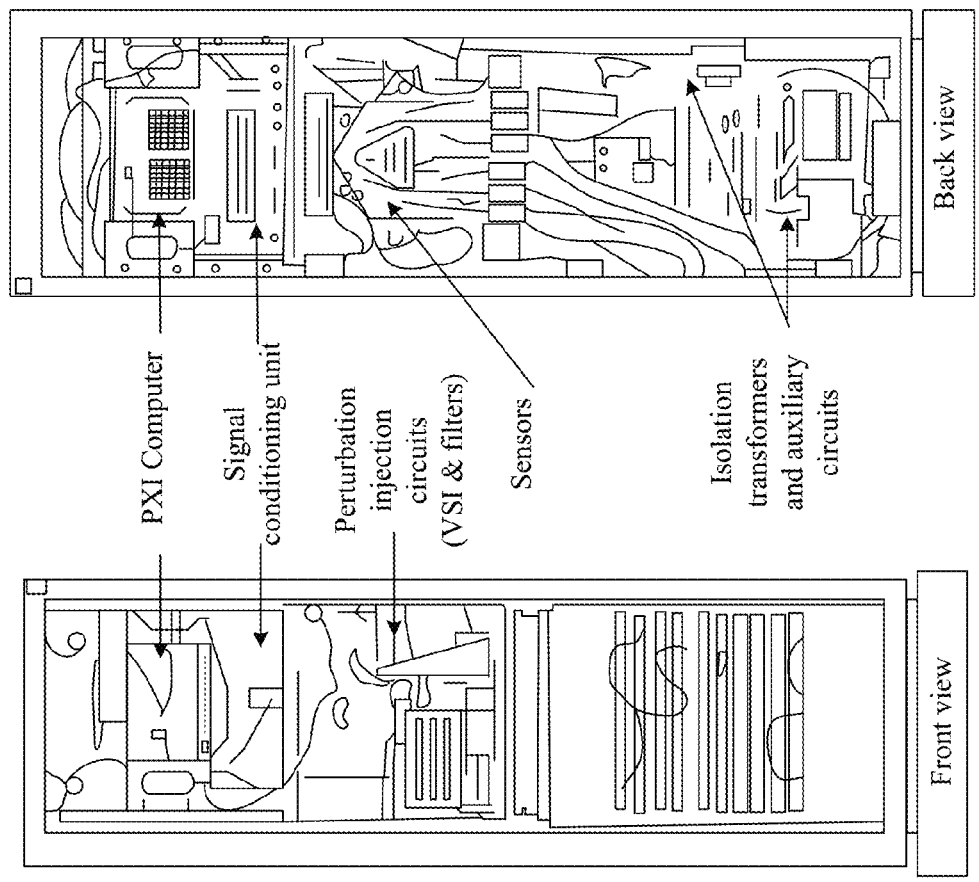
FIG. 9b illustrates an example impedance measurement system, consistent with certain disclosed embodiments.
Figure 10A:
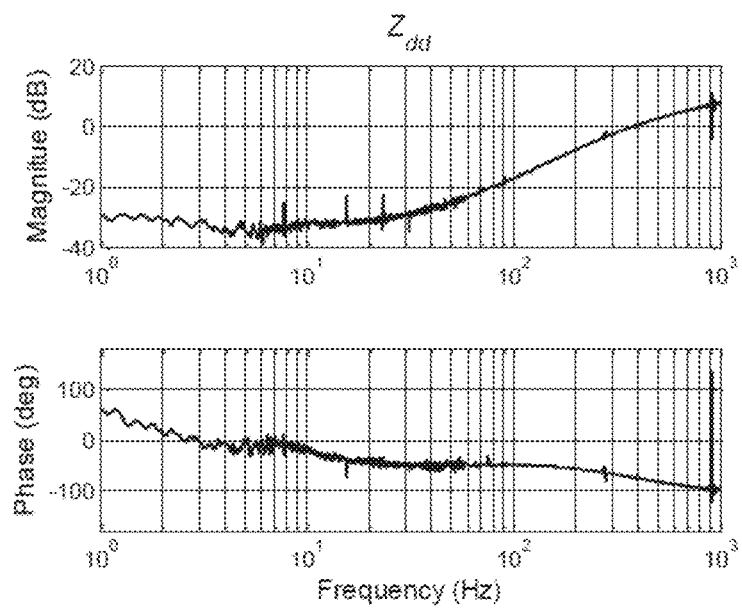
FIG. 10a graphically illustrates an example output impedance of a three-phase power supply, consistent with certain disclosed embodiments.
Figure 10B:
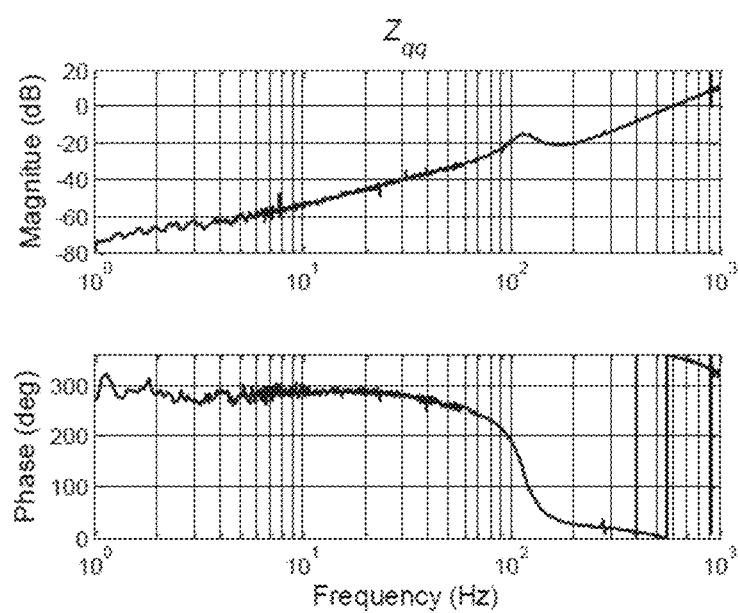
FIG. 10b graphically illustrates an example output impedance of a three-phase power supply, consistent with certain disclosed embodiments.
Figure 10C:
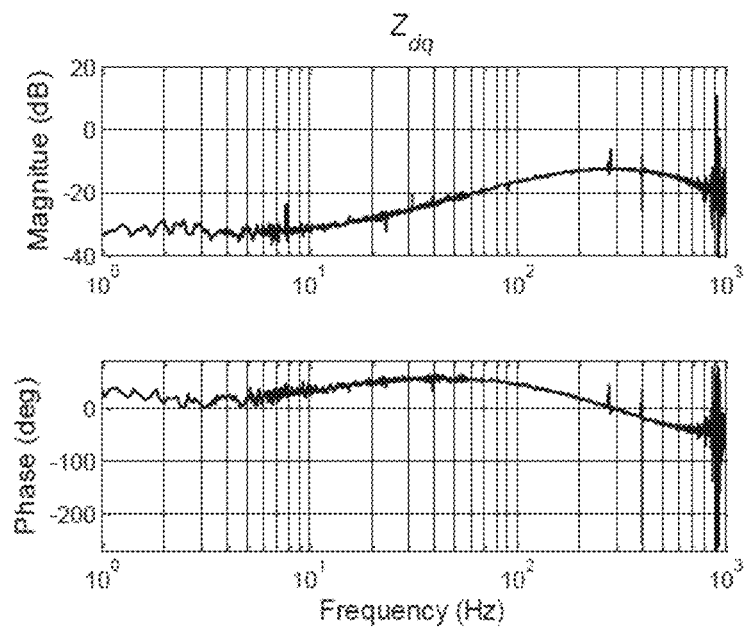
FIG. 10c graphically illustrates an example output impedance of a three-phase power supply, consistent with certain disclosed embodiments.
Figure 10D:
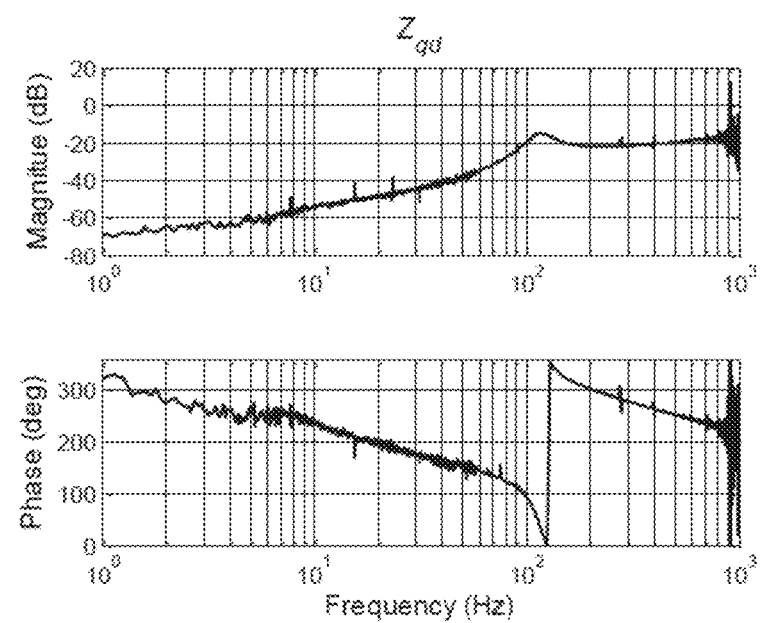
FIG. 10d graphically illustrates an example output impedance of a three-phase power supply, consistent with certain disclosed embodiments.
Figure 11A:
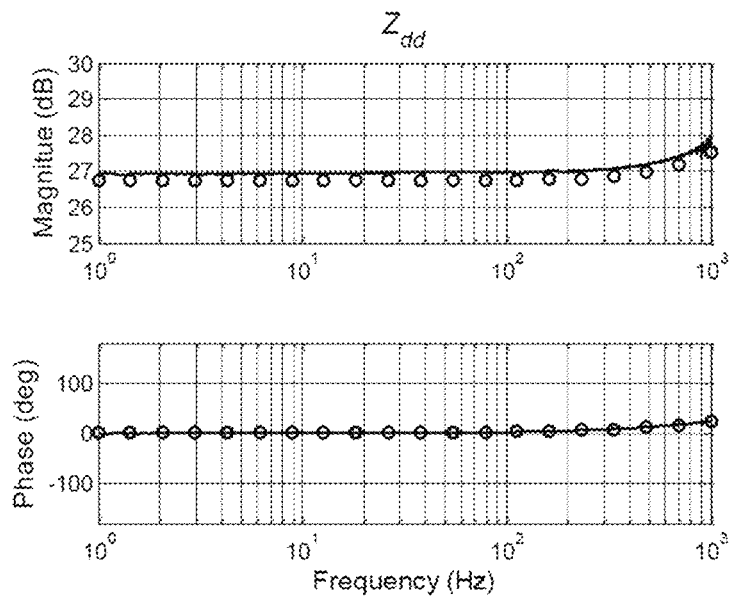
FIG. 11a graphically illustrates an example extracted impedance of a three-phase R-L load, consistent with certain disclosed embodiments.
Figure 11B:
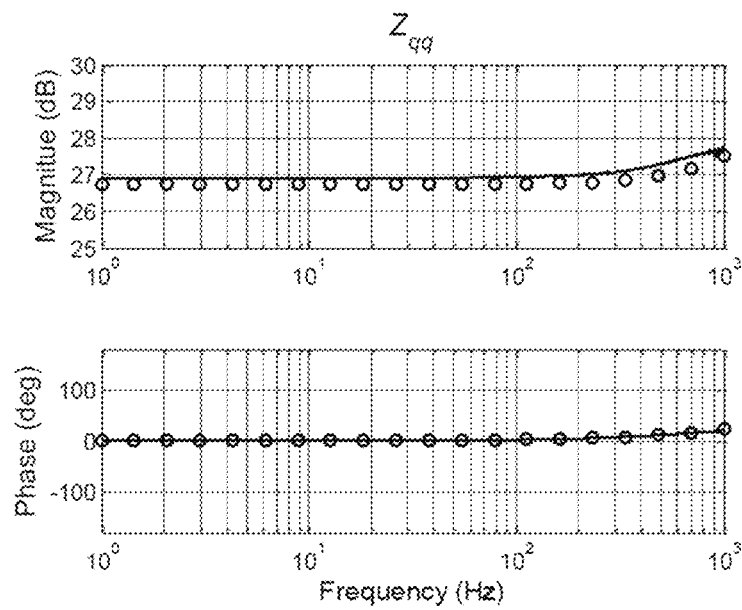
FIG. 11b graphically illustrates an example extracted impedance of a three-phase R-L load, consistent with certain disclosed embodiments.
Figure 11C:
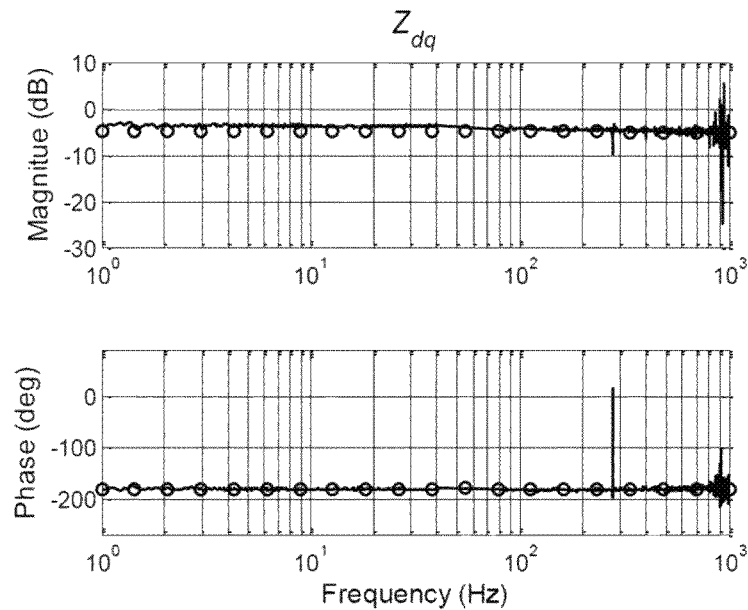
FIG. 11c graphically illustrates an example extracted impedance of a three-phase R-L load, consistent with certain disclosed embodiments.
Figure 11D:
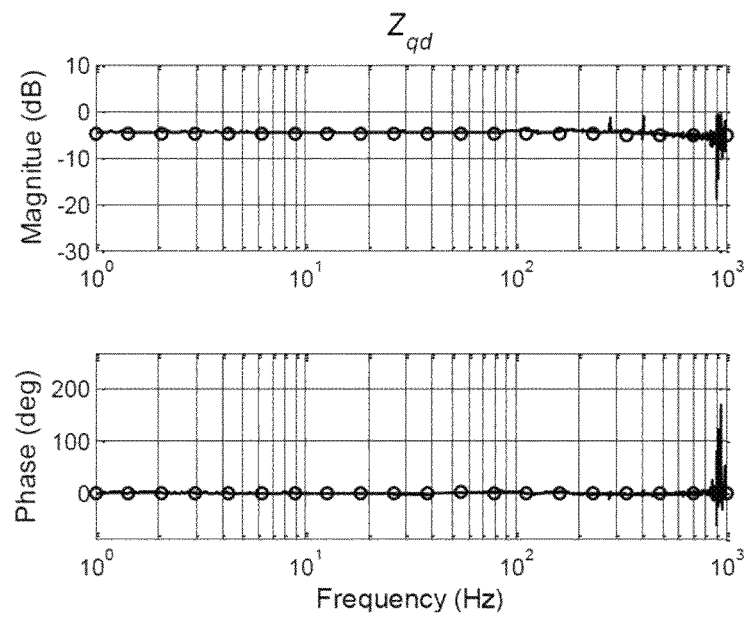
FIG. 11d graphically illustrates an example extracted impedance of a three-phase R-L load, consistent with certain disclosed embodiments.

FIGS. 9a and 9b are block diagrams illustrating example impedance measurement components. FIG. 9a is a block diagram illustrating an example impedance measurement system 900a, consistent with certain disclosed embodiments. FIG. 9b is a block diagram illustrating an example impedance measurement unit (IMU) 900b, consistent with certain disclosed embodiments. In some embodiments, IMU 900b illustrated in FIG. 9b may be used in connection with the impedance measurement system 900a illustrated in FIG. 9a. In FIG. 9b, IMU 900b may be configured to use a three-phase VSI to create perturbations and a PXI computer to acquire the response. As understood by one of ordinary skill in the art, a PXI computer is a PCI eXtensions for Instrumentation platform. The data captured by the PXI computer of FIG. 9b may be stored and post-processed by a host computer. In some embodiments, the host computer may be connected remotely to IMU 900b.

In some embodiments, IMU 900b of FIG. 9b may be configured to perform three primary tasks. The first task, which may be implemented using an injection circuit, may include setting and creating current and/or voltage perturbations in the system. This task may implemented by, for example, connecting the VSI into the system either in series, if voltage is injected, or in shunt, if current is injected. The second task, which may be implemented using a collection circuit, may include measuring the responses at the interface. For example, sensors at the interface may convert the responses into low-level analog signals. The low-level analog signal may be first processed by analog circuits then converted into digital signals by the PXI computer. The signals may then transferred from abc coordinates into dq coordinates using the phase information provided by the Phase Locked Loop (PLL) running real time in the PXI computer. The third task, which may be implemented by a control circuit, may include calculating the impedance matrix, as discussed above in connection with Equations (4), (5), (6), and (7). In some embodiments, the third task may be performed on a host computer, which may be configured to collect digital signals from the PXI computer. The host computer may also perform several auxiliary tasks, such as controlling the measurement control unit and interacting with the user. In certain embodiments, the host computer may run the measurement control unit and the user interface unit may be connected remotely through a high-speed wired connection, such as, for example, Ethernet, or wireless connection, such as, for example, Wi-Fi, Bluetooth, etc.

The injection circuit, collection circuit, and control unit of IMU 900b illustrated in FIG. 9b may each include one or more of the following components: at least one central processing unit (CPU) configured to execute computer program instructions to perform various processes and methods, random access memory (RAM) and read only memory (ROM) configured to access and store data and information and computer program instructions, I/O devices configured to provide input and/or output to the IMU (e.g., keyboard, mouse, display, speakers, printers, modems, network cards, etc.), and storage media or other suitable type of memory (e.g., such as, for example, RAM, ROM, programmable read-only memory (PROM), erasable programmable read-only memory (EPROM), electrically erasable programmable read-only memory (EEPROM), magnetic disks, optical disks, floppy disks, hard disks, removable cartridges, flash drives, any type of tangible and non-transitory storage medium), where the files that comprise an operating system, application programs including, for example, web browser application, email application and/or other applications, and data files are stored.

In addition, IMU 900b can include antennas, network interfaces that provide wireless and/or wire line digital and/or analog interface to one or more networks, a power source that provides an appropriate alternating current (AC) or direct current (DC) to power one or more components of IMU 900b, and a bus that allows communication among the various disclosed components of IMU 900b of FIG. 9b. Each of these components is well-known in the art and will not be discussed further.

Although not shown, IMU 900b can also include one or more mechanisms and/or devices by which IMU 900b can perform the methods as described herein. For example, IMU 900b can include one or more encoders, one or more decoders, one or more interleavers, one or more circular buffers, one or more multiplexers, one or more de-multiplexers, one or more permuters, one or more decryption units, one or more demodulation units, one or more arithmetic logic units and/or their constituent parts, etc. These mechanisms and/or devices can include any combination of hardware and/or software components and can be included, in whole or in part, in any of the components shown in FIG. 9b.

In one or more exemplary designs of IMU 900b of FIG. 9b, the functions described can be implemented in hardware, software, firmware, or any combination thereof. If implemented in software, the functions can be stored as one or more instructions or code on computer-readable medium, including the computer-readable medium described above (e.g., RAM, ROM, and storage media).

In certain embodiments, the measurement unit may be designed and implemented such that it may be used in a system up to 1000 kW. A subset of the parameters of the system to be measured is disclosed below in Table I.

TABLE I

System Parameters

| Parameter | Value |
|---|---|
| Source Voltage (rms per phase) | 100-266 V (line to neutral) |
| Source Current (rms per phase) | 10-125 A |
| System Frequency (in abc coordinates) | 40-100 Hz |
| Impedance Measurement Range (in dq coordinates) | 1-1000 Hz |

Protection may be important when designing the injection to avoid damaging either the IMU, such as IMU 900b of FIG. 9b, or the system under measurement. For shunt injection, whenever the injected current, system voltage, or the DC capacitor voltage exceeds its respective limit, the converter may be shut down and disconnected from the system by a breaker. This action breaks the interaction between the perturbation injection circuit and the system, and puts the circuit into a safe state. For series injection, in addition to the over voltage and over current protections used with shunt injection, over voltage and over current protections of transformer windings are added. The transformers step down the VSI output voltages and boost the output current capability of the injection circuit. If the load side of the system is shorted accidently during measurement, the full system voltage is applied on the low voltage side of the transformer, which can generate a very high voltage on the VSI output terminals. Thus the voltages on the transformer winding are monitored. Crowbars are used to short the windings if the measured voltage exceeds certain safety level to avoid the high voltages on VSI output terminals. Because this action may also cause the transformer winding currents to exceed its rating, the currents may be cut off immediately using a breaker in series with the winding at the high current side.

Although a response level may be increased through selection of the injection mode, it still may be small compared to the full system voltages or currents. During the analog-to-digital (AD) conversion, only the last few bits of the converted results carry the response information, and the resolution of the useful signal may be low. Therefore, it should be taken into account to increase the resolution when trying to measure the responses. In addition, the perturbed signals may be filtered to remove system fundamental frequency signals in order to improve SNR. In such an embodiment, the filters would need to be implemented such that they introduce the same attenuation and phase shift on all the signals. A separate group of signals containing the fundamental signal also may be used to obtain the phase information that is used in the coordinate transformation. In certain aspects, low pass filters may be used in the setup, but they may not be useful if impedances at low frequencies in dq coordinates are needed.

In other aspects, notch filters may be used. By filtering out only the frequencies around the system fundamental frequency, the measurable frequency can be pushed to a lower range. In order to cope with a small system frequency variation, the filter's stop band may be designed to cover a certain frequency variation. In addition, an oversampling technique may be used to increase the effective resolution of the AD conversion. As one example of an oversampling technique, the signal is first sampled at 2 Msps, then the average of every 100 points is taken before further processing. This improves the conversion resolution by approximately 6 bits and, by having 16 bit resolution chips, measurement results can be improved even when the response signal is only about one thousandths of the full-scale value of the sensing circuits. By having no additional analog filters, this approach can lower the measurable frequency to near zero hertz.

To further reduce the influence from noise, direct spectrum analysis using Fast Fourier transformation (FFT) may not be used. Instead, transfer functions from perturbation reference to response signals are calculated first using correlation techniques, after which the impedance matrix is solved using the transfer functions.

FIGS. 10a-10d illustrate example output impedances of a three-phase power supply, consistent with certain disclosed embodiments. That is, FIGS. 10a-10d illustrate a setup used to verify the performance of disclosed embodiments. In one embodiment of the examples of FIGS. 10a-10d, a three phase power supply is used, having a good output voltage regulation under transient and distorting load, resulting in a low-value of output impedance. As shown in FIGS. 10a-10d, all the elements of the output impedance are smaller than a few tens of milliohms at low frequency range, which is less than one hundredths of the load side impedances. In certain embodiments, series injections should be used for the load side measurement.

FIGS. 11a-11d illustrate example extracted impedances of a three-phase R-L load, consistent with certain disclosed embodiments. That is, FIGS. 11a-11d illustrate a simulation setup used to verify the performance of disclosed embodiments, where a three phase load consisting of resistors and inductors in series is used as an example of linear load. In FIGS. 11a-11d, the source-side impedances may be different from simulation source-side impedances, since they come from the internal impedance of a power supply and parasitic values of the wires. The load bank is specified as the values used in the simulation circuit. In FIGS. 11a-11d the graphed solid lines represent a proposed approach, whereas the circles represent a phase-by-phase offline measurement of the impedance of the load bank, as points of comparison. The obtained impedances are transferred into the dq coordinate system to allow for comparison with other measured results.

In FIGS. 11a-11d, because they are magnified to reveal the differences, the vertical scales of the four figures appear different because they are magnified to reveal the differences. While there are several spikes shown on the dotted curve, these are caused by the existence of steady-state voltage or current harmonics in the system to be measured at those specific frequency points. Since the IMU, such as IMU 900b of FIG. 9b, needs to measure only the small-signal perturbation around the steady-state trajectory, these existing signals due to background distortion may be interpreted by the IMU, such as IMU 900b of FIG. 9b, as small-signal perturbation and thus behave as part of the noise for the measurement system. In such situations, it may increase the noise level and lower SNR at these frequency points, thereby generating a higher measurement error.

The magnitude difference in $Z_{dd}$ and $Z_{qq}$ may be due to the change of the load bank resistance. When the load bank is measured in the system, the current causes the temperature to increase by more than one hundred degrees Celsius, which leads to resistance increase. $Z_{dq}$ and $Z_{qd}$ also show noisy results at higher frequencies, but this may be due to lower perturbation signals. In fact, the injection circuit runs open loop for series injection with constant injection level over all the frequencies, but the VSI low-pass output filter attenuates the injected voltage higher frequency range. Moreover, the source impedances increase at higher frequency, and thus a lower portion of perturbation may be applied at the load side.

Figure 12:
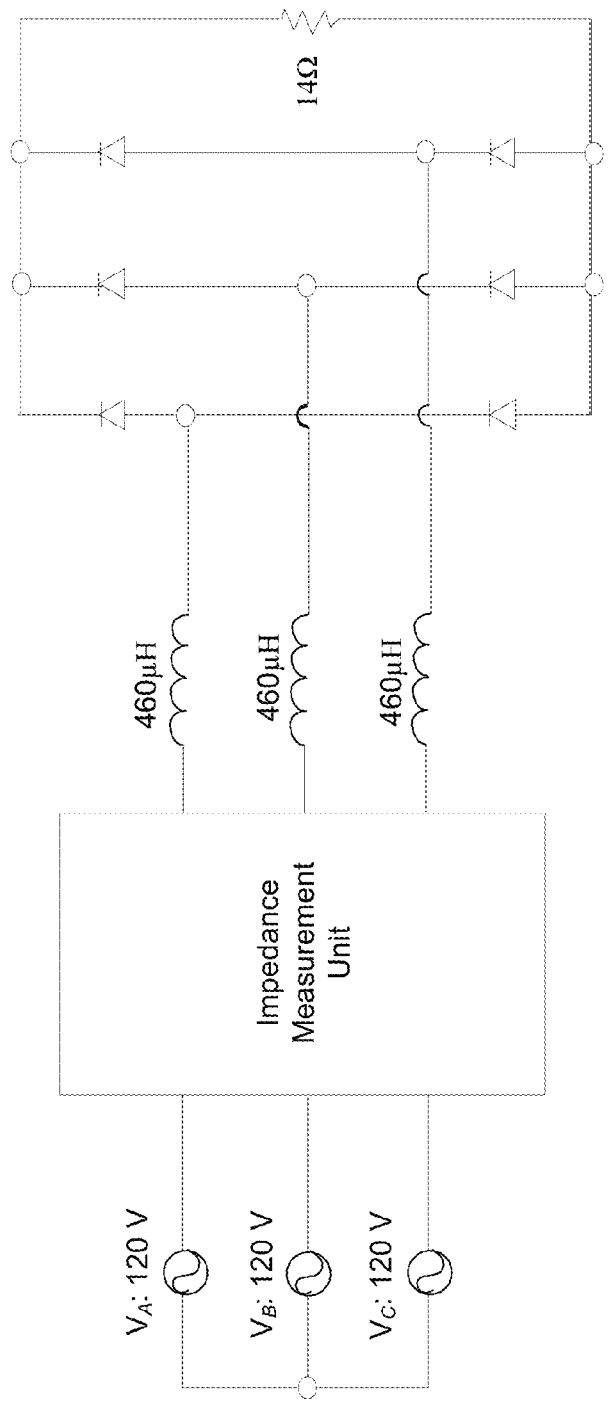
FIG. 12 schematically illustrates an example measurement system including a six-pulse diode rectifier, consistent with certain disclosed embodiments.
Figure 13A:
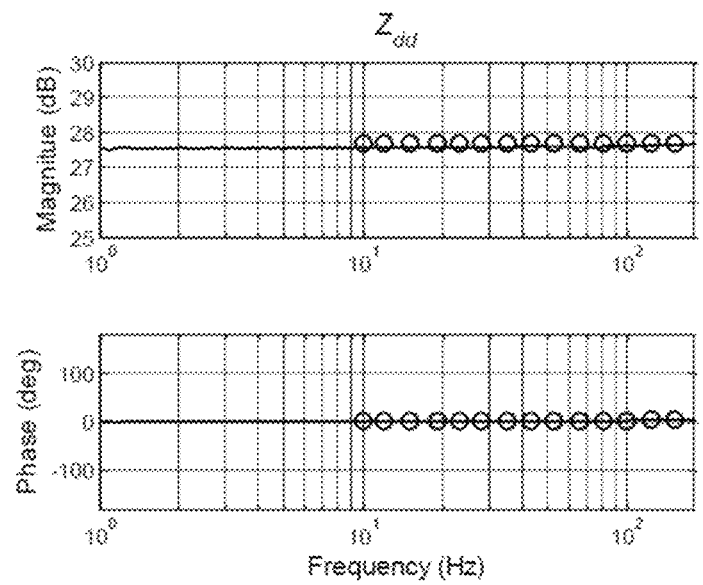
FIG. 13a graphically illustrates an example extracted impedance of an input impedance of a diode rectifier, consistent with certain disclosed embodiments.
Figure 13B:
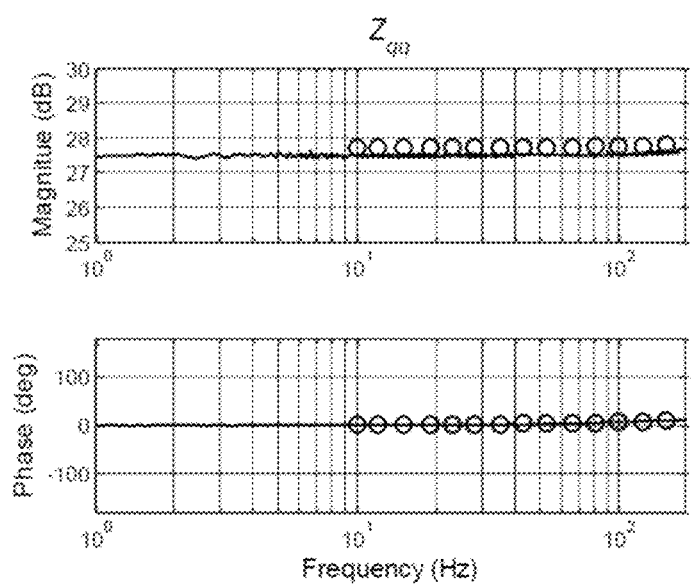
FIG. 13b graphically illustrates an example extracted impedance of an input impedance of a diode rectifier, consistent with certain disclosed embodiments.
Figure 13C:
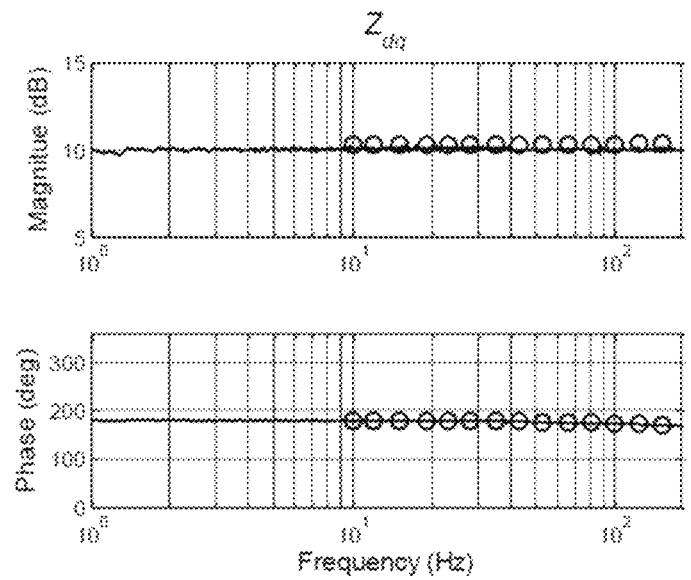
FIG. 13c graphically illustrates an example extracted impedance of an input impedance of a diode rectifier, consistent with certain disclosed embodiments.
Figure 13D:
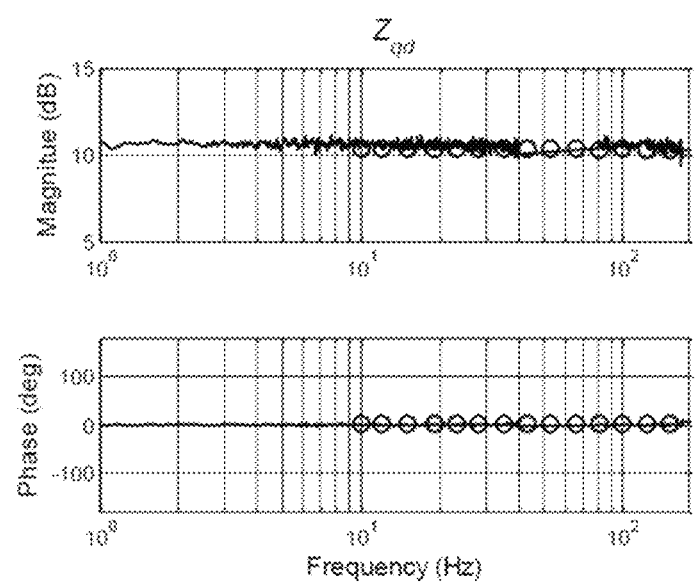
FIG. 13d graphically illustrates an example extracted impedance of an input impedance of a diode rectifier, consistent with certain disclosed embodiments.

FIG. 12 illustrates an example measurement system 1200 including a six-pulse diode rectifier, consistent with certain disclosed embodiments. The example measurement system 1200 of FIG. 12 may be used to test performance of the IMU, such as IMU 900b of FIG. 9b, with non-linear loads. The measured results may be compared to simulation results, as shown in FIGS. 13a-13d.

FIGS. 13a-13d illustrate example extracted impedances of an input impedance of a diode rectifier, consistent with certain disclosed embodiments. In FIGS. 13a-13d, a non-linear load is applied and a diode bridge is measured. The obtained measurement results of FIGS. 13a-13d are compared with impedances extracted from a switching model using a sinusoidal injection AC sweep algorithm.

The identification and subsequent measurement of source and load impedances are useful tools for assessing and evaluating stability of electrical power systems. Stability can be assessed by frequency domain analysis of the "minor loop gain" transfer function, which is defined as the $Z_S/Z_L$ impedance ratio. In order to measure source and load impedance at an AC electrical system interface, a perturbation is injected in the direct and quadrature (dq) reference frame. The voltage and current response to the perturbation are then measured. This measured data is post processed to obtain the spectra of the voltages and currents which are then used to calculate $Z_S$ and $Z_L$.

When using only the shunt mode, at AC interfaces, the source impedance is usually much smaller than the load impedance because most of the injected current flows into the low impedance source side. The high impedance load side is not disturbed enough resulting in a low Signal-to-Noise Ratio (SNR) which is not good for measurement accuracy. An improvement in the load side SNR can be realized using a combination of shunt and series injections. That is, the disclosed embodiments include the additional application of a series injection mode when measuring the high impedance side (typically the load side in AC systems), wherein instead of injecting perturbation current, a voltage perturbation is used. In this way, most of the injected power flows to the higher impedance Load side thereby raising the load side measurement SNR, which results in a more accurate measurement.

While the foregoing written description of the invention enables one of ordinary skill to make and use what is considered presently to be the best mode thereof, those of ordinary skill will understand and appreciate the existence of variations, combinations, and equivalents of particular disclosed embodiments, systems, methods. The invention should therefore not be limited by the described embodiments, but by all embodiments and methods within the scope and spirit of the invention.

What is claimed is:

1. A method of impedance measurement in a three-phase alternating current (AC) system, the method comprising:
    connecting a perturbation injector to the three-phase AC system, the perturbation injector comprising a voltage source inverter having a shunt injection circuit and a series injection circuit that are operable without active DC power addition;
    connecting by the perturbation injector the shunt injection circuit to the three-phase AC system;
    injecting by the shunt injection circuit a shunt perturbation signal into the three-phase AC system;
    collecting by a collection circuit of an impedance measurement unit a response to the shunt perturbation signal;
    switching by the perturbation injector from the shunt injection circuit to the series injection circuit;
    injecting by the series injection circuit a series perturbation signal into the three-phase AC system;
    collecting by the collection circuit of the impedance measurement unit a response to the series perturbation signal;
    transferring by an instrumentation platform computer the response to the shunt perturbation signal and the response to the series perturbation signal from three-phase (abc) coordinates to direct and quadrature (dq); and
    calculating by a control circuit at least one impedance of the three-phase AC system based on the response to the shunt perturbation signal and the response to the series perturbation signal.

2. The method of claim 1, wherein the shunt perturbation signal is configured according to the following:

$$\begin{bmatrix} I_{sd}(s) \\ I_{sq}(s) \end{bmatrix} = Z_{Ldq}(s)(Z_{Sdq}(s) + Z_{Ldq}(s))^{-1} \begin{bmatrix} I_{pd}(s) \\ I_{pq}(s) \end{bmatrix}$$

$$\begin{bmatrix} I_{Ld}(s) \\ I_{Lq}(s) \end{bmatrix} = Z_{Sdq}(s)(Z_{Sdq}(s) + Z_{Ldq}(s))^{-1} \begin{bmatrix} I_{pd}(s) \\ I_{pq}(s) \end{bmatrix}$$

where $Z_{Sdq}(s)$ is a source impedance matrix, $Z_{Ldq}(s)$ is a load impedance matrix, $I_{sd}(s)$ is a d-axis source current, $I_{sq}(s)$ is a q-axis source current, $I_{pd}(s)$ is a d-axis perturbation current, $I_{pq}(s)$ is a q-axis perturbation current, $I_{Ld}(s)$ is a d-axis load current, and $I_{Lq}(s)$ is a q-axis load current.

3. The method of claim 1, wherein the series perturbation signal is configured according to the following:

$$\begin{bmatrix} V_{sd}(s) \\ V_{sq}(s) \end{bmatrix} = Z_{Sdq}(s)(Z_{Sdq}(s) + Z_{Ldq}(s))^{-1} \begin{bmatrix} V_{pd}(s) \\ V_{pq}(s) \end{bmatrix}$$

$$\begin{bmatrix} V_{Ld}(s) \\ V_{Lq}(s) \end{bmatrix} = Z_{Ldq}(s)(Z_{Sdq}(s) + Z_{Ldq}(s))^{-1} \begin{bmatrix} V_{pd}(s) \\ V_{pq}(s) \end{bmatrix}$$

where $Z_{Sdq}(s)$ is a source impedance matrix, $Z_{Ldq}(s)$ is a load impedance matrix, $V_{sd}(s)$ is a d-axis source voltage, $V_{sq}(s)$ is a q-axis source voltage, $V_{pd}(s)$ is a d-axis perturbation voltage, $V_{pq}(s)$ is a q-axis perturbation voltage, $V_{Ld}(s)$ is a d-axis load voltage, and $V_{Lq}(s)$ is a q-axis load voltage.

4. The method of claim 1, wherein the series perturbation signal is of the form:

$$x(t) = \sin\left(2\pi\left(f_0 + \frac{f_1 - f_0}{2T}t\right)t\right),$$

where $f_0$ is a start frequency, $f_1$ is an end frequency, T is a duration of at least one of the first perturbation signal and the second perturbation signal; and t is a time.

5. The method of claim 1, wherein the action of transferring the response to the shunt perturbation signal and the response to the series perturbation signal from abc coordinate to dq coordinates comprises:
transforming an AC voltage to direct current (DC) voltage components; and
transforming an AC current to DC current components.

6. The method of claim 1, wherein the action of calculating at least one impedance of the three-phase AC system comprises:
identifying frequency points of interest; and
calculating impedance at each identified frequency point.

7. A system for performing impedance measurement in a three-phase alternating current (AC) system, comprising:
a perturbation injector connectable to the three-phase AC system, the perturbation injector comprising a voltage source inverter having a shunt injection circuit configured to inject a shunt perturbation signal into the three-phase AC system and a series injection circuit configured to inject a series perturbation signal into the three-phase AC system, the voltage source inverter being selectively switchable from the shunt injection circuit to the series injection circuit, both of which are operable without active DC power addition;
a collection circuit configured to collect a response to the shunt perturbation signal and a response to the series perturbation signal; and
a control unit configured to transfer the response to the shunt perturbation signal and the response to the series perturbation signal from three-phase (abc) coordinates to direct and quadrature (dq) and to calculate at least one impedance of the three-phase AC system based on the response to the first perturbation signal and the response to the second perturbation signal.

8. The system of claim 7, wherein the shunt injection circuit is configured to inject the shunt perturbation signal according to the following:

$$\begin{bmatrix} I_{sd}(s) \\ I_{sq}(s) \end{bmatrix} = Z_{Ldq}(s)(Z_{Sdq}(s) + Z_{Ldq}(s))^{-1} \begin{bmatrix} I_{pd}(s) \\ I_{pq}(s) \end{bmatrix}$$

$$\begin{bmatrix} I_{Ld}(s) \\ I_{Lq}(s) \end{bmatrix} = Z_{Sdq}(s)(Z_{Sdq}(s) + Z_{Ldq}(s))^{-1} \begin{bmatrix} I_{pd}(s) \\ I_{pq}(s) \end{bmatrix}$$

where $Z_{Sdq}(s)$ is a source impedance matrix, $Z_{Ldq}(s)$ is a load impedance matrix, $I_{sd}(s)$ is a d-axis source current, $I_{sq}(s)$ is a q-axis source current, $I_{pd}(s)$ is a d-axis perturbation current, $I_{pq}(s)$ is a q-axis perturbation current, $I_{Ld}(s)$ is a d-axis load current, and $I_{Lq}(s)$ is a q-axis load current.

9. The system of claim 7, wherein the series injection circuit is configured to inject the series perturbation signal according to the following:

$$\begin{bmatrix} V_{sd}(s) \\ V_{sq}(s) \end{bmatrix} = Z_{Sdq}(s)(Z_{Sdq}(s) + Z_{Ldq}(s))^{-1} \begin{bmatrix} V_{pd}(s) \\ V_{pq}(s) \end{bmatrix}$$

$$\begin{bmatrix} V_{Ld}(s) \\ V_{Lq}(s) \end{bmatrix} = Z_{Ldq}(s)(Z_{Sdq}(s) + Z_{Ldq}(s))^{-1} \begin{bmatrix} V_{pd}(s) \\ V_{pq}(s) \end{bmatrix}$$

where $Z_{Sdq}(s)$ is a source impedance matrix, $Z_{Ldq}(s)$ is a load impedance matrix, $V_{sd}(s)$ is a d-axis source voltage, $V_{sq}(s)$ is a q-axis source voltage, $V_{pd}(s)$ is a d-axis perturbation voltage, $V_{pq}(s)$ is a q-axis perturbation voltage, $V_{Ld}(s)$ is a d-axis load voltage, and $V_{Lq}(s)$ is a q-axis load voltage.

10. The system of claim 7, wherein the series perturbation signal is of the form:

$$x(t) = \sin\left(2\pi\left(f_0 + \frac{f_1 - f_0}{2T}t\right)t\right),$$

where $f_0$ is a start frequency, $f_1$ is an end frequency, T is a duration of at least one of the first perturbation signal and the second perturbation signal; and t is a time.

11. The system of claim 7, wherein the control unit is configured to transform an AC voltage to direct current (DC) voltage components, and transform an AC current to DC current components.

12. The system of claim 7, wherein the control unit is configured to calculate the impedances of the three-phase AC system at each frequency point.

* * * * *